United States Patent [19]

Takahashi et al.

[11] Patent Number: 5,589,306
[45] Date of Patent: Dec. 31, 1996

[54] PHOTOSENSITIVE RESIN COMPOSITION FOR PRODUCING A RELIEF PRINTING PLATE

[75] Inventors: Masahiko Takahashi; Shusaku Tabata, both of Fuji, Japan

[73] Assignee: Asahi Kasei Kogyo Kabushiki Kaisha, Osaka, Japan

[21] Appl. No.: 985,233

[22] Filed: Dec. 2, 1992

Related U.S. Application Data

[60] Continuation of Ser. No. 641,762, Jan. 16, 1991, abandoned, which is a division of Ser. No. 326,902, Mar. 21, 1989, abandoned.

[30] Foreign Application Priority Data

Mar. 26, 1988 [JP] Japan ................................ 63-072926

[51] Int. Cl.$^6$ .............................. G03C 3/00; G03F 7/035
[52] U.S. Cl. ..................... 430/18; 430/286.1; 430/306; 430/309; 430/284.1
[58] Field of Search .................................. 430/308, 306, 430/309, 286, 18, 284.1

[56] References Cited

U.S. PATENT DOCUMENTS

| | | | |
|---|---|---|---|
| 3,663,222 | 5/1972 | Akamatsu et al. | 430/306 |
| 4,563,438 | 1/1986 | Berner et al. | 430/281 X |
| 4,600,667 | 7/1986 | Uchida | 430/306 |
| 4,927,723 | 5/1990 | Cusoin | 430/306 |
| 5,034,307 | 7/1991 | Riediker et al. | 430/325 |
| 5,085,669 | 2/1992 | Frommeld et al. | 82/568 |
| 5,288,571 | 2/1994 | Nakamura et al. | 430/309 |

FOREIGN PATENT DOCUMENTS

| | | |
|---|---|---|
| 0007468 | 2/1980 | European Pat. Off. . |
| 0007508 | 2/1980 | European Pat. Off. . |
| 0196033 | 10/1986 | European Pat. Off. ............... 430/306 |
| 36410014 | 6/1988 | Germany . |
| 3834299 | 4/1990 | Germany . |
| 62-231245 | 10/1987 | Japan . |
| 2198736 | 6/1988 | United Kingdom . |

OTHER PUBLICATIONS

Derwent AN88–168459 [25] WPIDS of DE 3641014 (Pub Jun. 1988).

Herbert Czichon et al, "Technology of Manufacturing Photo-Relief Forms", *Polish Technology Reviews*, 1982 pp. 38–40.

Stohler et al., Pertial English translation of "New Results Considering . . . ", *Die Angewandte Makromolekulare Chemie*, 158/159, 233–246, 1988.

"Photoinitiators for Daylight Curable Coatings", *Research Disclosure*, 28347, Nov. 1987.

Berner et al., *J. Oil Col. Chem. Assoc.*, 61, 1978, 105–113.

English–Language Translation of JP 62–231245 Pub Oct. 1987.

Patent Abstracts of Japan, vol. 9, No. 41 (C–267) [1764] Feb. 21, 1985 of JP–A–59–184 227 (Mitsubishi Kasei Kogyo K.K.) Oct. 19, 1984. (Abstract).

*Primary Examiner*—Janis L. Dote
*Attorney, Agent, or Firm*—Birch, Stewart, Kolasch & Birch, LLP

[57] ABSTRACT

A photosensitive resin composition for producing a relief printing plate is disclosed, which comprises a polymer selected from the group consisting of a prepolymer, a binder polymer and a mixture thereof, an ethylenically unsaturated monomer, a specific hindered amine and a photopolymerization initiator. Even when the photosensitive resin composition is excessively irradiated with strong actinic rays in order to cure the resin composition to its inner portion sufficiently, the surface of the resin composition does not undergo photodeterioration by virtue of the hindered amine contained therein, thereby imparting excellent toughness to the photocured resin composition throughout the entire thickness thereof. Thus, a relief printing plate having excellent printing resistance can be produced.

2 Claims, 2 Drawing Sheets

PHOTOSENSITIVE RESIN COMPOSITION FOR PRODUCING A RELIEF PRINTING PLATE

This application is a continuation of application Ser. No. 07/641,762 filed on Jan. 16, 1991, now abandoned, which is a divisional of application Ser. No. 07/326,902 filed on Mar. 21, 1989, now abandoned.

BACKGROUND OF THE INVENTION

1. Field of the Invention

The present invention relates to a photosensitive resin composition for producing a relief printing plate. More particularly, the present invention is concerned with a photosensitive resin composition containing a specific hindered amine having a piperidine ring, which composition is capable of providing a printing plate having excellent printing resistance. The photosensitive resin composition is advantageously used as a material for preparing a printing plate, particularly a printing plate for use in flexographic printing, printing of a corrugated board, stamping, or the like.

2. Discussion of Related Art

In recent years, rapid progress has been made with respect to photosensitive resin compositions. These photosensitive resin compositions are now widely used for producing photoreliefs. For example, an image relief to be used for preparing a relief printing plate and the like, or an image resist to be used in etching for preparing a lithographic plate, a gravure, a printed circuit, an integrated circuit, a shadow mask and the like. Also, the photosensitive resin compositions are now widely used as a photosensitive vehicle for a coating composition, an adhesive or a printing ink.

In the preparation of a printing plate by the use of a photosensitive resin composition, the photosensitive resin compositions are generally photopolymerized by irradiation of actinic rays, such as ultraviolet rays, to form a three dimensional structure so that the photosensitive resin compositions provide cured areas which are insoluble in water, an organic solvents and the like. When a photosensitive resin composition is cured to form a printing plate having a relatively large thickness, such as a relief printing plate, the composition must be exposed to actinic rays for a prolonged period of time until even the inner portion of the composition is sufficiently cured. Consequently, the surface portion of the photosensitive resin composition is inevitably irradiated by actinic rays of a ray quantity which would exceed the amount sufficient for curing only the surface portion of the composition. Thus, the surface portion of the composition is excessively irradiated by the actinic rays. As a result, the surface portion cured by photopolymerization undergoes photodeterioration due to the excessive irradiation of by the actinic rays so that the tensile elongation at break and the tensile strength at break of the resultant printing plate are likely to be lowered, thereby leading to the printing plate having poor printing resistance. In other words, the photocured surface portion of the resin composition becomes brittle. That is, the mechanical strengths, such as toughness defined as the product of tensile elongation at break multiplied by tensile strength at break, of the resultant printing plate are lowered so that the relief of the printing plate is likely to be broken during practical printing operation.

On the other hand, when the quantity of actinic rays for irradiation is reduced, the inner portion of the photosensitive resin composition is not sufficiently cured so that the resultant printing plate is insufficient in mechanical properties, such as tensile elongation at break and tensile strength at break, thereby causing the ultimate printing plate to have poor printing resistance.

In this connection, it is noted that the photocured resin layer of a relief printing plate generally has a thickness as large as from 0.5 to 10.0 mm. Particularly, in the printing of a corrugated board, since the corrugated board is very soft, the printing plate to be used generally has a thickness as large as from 3 to 10 mm and the relief layer thereof has a thickness of from 1 to 9 mm which is large as compared to printing plates which are to be used in printings other than relief printing. Due to such a large thickness of the desired relief layer, non-uniform crosslinking of the photosensitive resin along the thickness of the final relief layer brings about a large problem in preparing a relief printing plate from a photosensitive resin composition.

As apparent from the above, it is difficult to prepare a relief printing plate having a good balance of mechanical strength as between the surface portion and the inner portion.

There have been proposals for overcoming the non-uniformity in curing degree between the surface portion and the inner portion of a photosensitive resin composition which is present due to the difference in light penetration within the photosensitive resin. For example, in the field of ultraviolet absorbing coatings having a thickness of 0.1 mm or less, it was proposed to cure the surface portion of photosensitive resin composition with ultraviolet rays having a relatively short wavelength and cure the inner portion of the composition with ultraviolet rays having a relatively long wavelength (see U.S. Pat. No. 4,182,665). This technique of using actinic rays having different wavelengths has applied in the preparation of a relief printing plate, since the depth which actinic rays can reach in a photosensitive resin composition is very small. Thus, when the thickness of a layer of a photosensitive resin composition exceeds 1 mm, such a technique cannot provide a good balance of mechanical strengths as between the surface portion and the inner portion of the ultimate relief printing plate. Therefore, the above-mentioned problem cannot be overcome by this technique.

It has also been proposed to incorporate an ultraviolet absorber or a conventional radical quencher into a photosensitive resin composition or to coat the surface of a photosensitive resin composition with an ultraviolet absorber or a conventional radical quencher. However, these proposals have not been successful in providing a good balance of mechanical strengths between the surface portion and the inner portion of a relief printing plate. Therefore, the above-mentioned problem also cannot be overcome by these proposals.

Meanwhile, an ultraviolet absorber and a cyclic hindered amine have been known as a light stabilizer for preventing the photodeterioration of a polymer. For improving the sunlight resistance and preventing the discoloration of a polymer, it has been attempted to incorporate an ultraviolet absorber or a cyclic hindered amine into a lacquer, a coating composition, a molding material, a coating material or an ink (see U.S. Pat. Nos. 4,279,720 and 4,284,485 and Japanese Patent Application Laid-Open Specification Nos. 59-168073 and 59-184227). However, these attempts were made in order to improve the sunlight resistance and to prevent the discoloration of a polymer by sunlight, in particular, in order to improve the sunlight resistance and to prevent discoloration of a polymer for a very long period of time, e.g., several years.

Up to the present time, no attempt has been made to prevent a photosensitive resin from being photodeteriorated or to prevent the mechanical strengths from being lowered by modifying the photosensitive resin composition during the irradiation of strong actinic rays having a main wavelength zone in the ultraviolet region for a short period of time, i.e., at most several tens of minutes, in order to prepare a relief printing plate.

SUMMARY OF THE INVENTION

The present inventors have made extensive and intensive studies with a view toward developing a photosensitive resin composition capable of providing a relief printing plate having excellent printing resistance. As a result, it has unexpectedly been found that when a specific hindered amine is incorporated in a specific amount, into a photosensitive resin composition comprising a polymer selected from the group consisting of a prepolymer, a binder polymer and a mixture thereof, an ethylenically unsaturated monomer and a photopolymerization initiator, even if the resultant photosensitive resin composition is subjected to excessive irradiation by actinic rays in the preparation of a relief printing plate, the photocured resin composition maintains excellent toughness throughout the entire thickness by virtue of the specific cyclic hindered amine, thereby providing a relief printing plate having excellent printing resistance. The present invention has been completed on the basis of this novel finding.

It is, accordingly, an object of the present invention to provide a photosensitive resin composition for producing a relief printing plate having excellent printing resistance due to its uniform excellent mechanical strengths throughout the entire thickness of the photorelief portion of the printing plate.

It is another object of the present invention to provide a method for producing a relief printing plate having excellent printing resistance.

The foregoing and other objects, features and advantages will be apparent to those skilled in the art from the following detailed description and claims taken in connection with the accompanying drawings.

BRIEF DESCRIPTION OF THE DRAWINGS

In the drawings:

FIGS. 1 to 3 show diagrams illustrating a process for preparing a relief printing plate, in which FIG. 1 is a diagrammatic cross-sectional view of a laminated structure which is to be subjected to masking, relief and back exposures, FIG. 2 is a diagrammatic cross-sectional illustration showing an arrangement employed for effecting the masking exposure and the relief exposure, and FIG. 3 is a diagrammatic cross-sectional illustration showing an arrangement employed for effecting the back exposure;

In FIGS. 1 to 4, like parts or portions are designated by like numerals or characters.

DETAILED DESCRIPTION OF THE INVENTION

Figure 1:
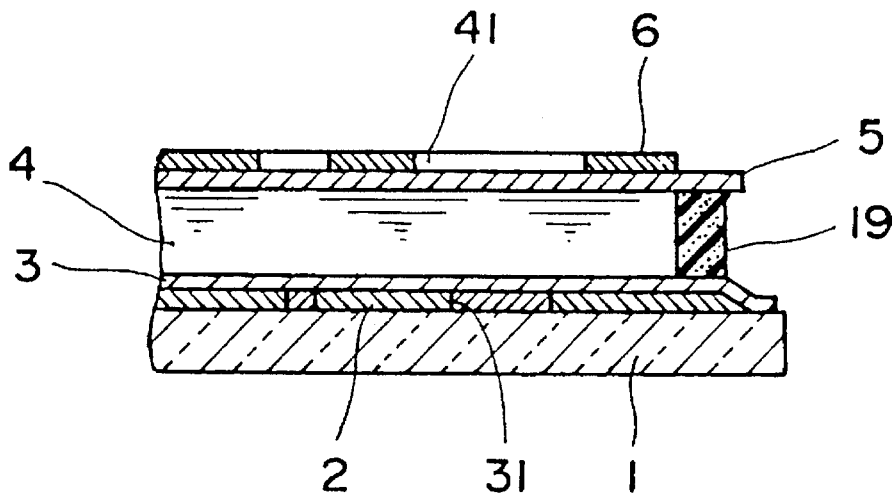

According to the present invention, there is provided a photosensitive resin composition for producing a relief printing plate comprising:

(A) from 5.0 to 98.0% by weight, based on the total weight of components (A), (B), (C) and (D), of a polymer selected from the group consisting of a prepolymer, a binder polymer and a mixture thereof, (B) from 1.0 to 94.0% by weight, based on the total weight of components (A), (B), (C) and (D), of an ethylenically unsaturated monomer, (C) from 0.05 to 10.0% by weight, based on the total weight of components (A), (B), (C) and (D), of a hindered amine having a piperidine ring represented by the formula:

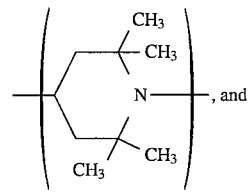, and (D) from 0.001 to 10.0% by weight, based on the total weight of components (A), (B), (C) and (D), of a photopolymerization initiator.

The prepolymer when used as component (A) in the present invention is a prepolymer having an ethylenically unsaturated group, which is photopolymerizable by exposure to actinic rays. The prepolymer is photopolymerized alone or together with an ethylenically unsaturated monomer to thereby form a three dimensional network. The three dimensional network contributes to the excellent toughness of the ultimate cured product. The prepolymer has at least one ethylenically unsaturated group. However, it is preferred to use a prepolymer having 2 or more ethylenically unsaturated groups from the viewpoint of the desired toughness of the ultimate printing plate.

On the other hand, the binder polymer when used as component (A) in the present invention is a polymer which is, in general, substantially intact with respect to photopolymerization. The binder polymer is entangled in a network formed by photopolymerization of the ethylenically unsaturated monomer and the prepolymer, and thereby contributes to an increase in the mechanical strength of the ultimate cured product.

In the present invention, any one of the above-mentioned prepolymer, binder polymer or mixture thereof may be used as component (A). However, when a binder polymer is used alone, component (B) is generally selected from a monomer having at least two ethylenically unsaturated groups and a mixture thereof with a monomer having a single ethylenically unsaturated group.

There is no particular limitation with respect to the number average molecular weight of the prepolymer and the binder polymer. However, each of the prepolymer and the binder polymer generally has a number average molecular weight of from 2,000 to 200,000, preferably from 5,000 to 100,000. When the number average molecular weight is less than 2,000, the toughness of the ultimate printing plate is likely to be low. On the other hand, when the number average molecular weight is greater than 200,000, although the ultimate printing plate has good toughness, it is difficult to completely wash-out the uncured portions of the photosensitive resin after exposure to actinic rays because the uncured portions have high viscosity, leading to difficulties in obtaining a clear relief pattern.

The photosensitive resin composition of the present invention may be either liquid or solid. When a liquid photosensitive resin composition is desired, it is preferred that the number average molecular weight of the prepolymer and the binder polymer each be in the range of from 2,000 to 50,000, since the employment of such a molecular weight provides a composition with a low viscosity so that handling of the composition is facilitated in the coating of a substrate and removal of uncured composition can be readily performed in a development step. On the other hand, when a solid photosensitive resin composition is to be produced, the number average molecular weight of the prepolymer and the binder polymer, particularly the binder polymer which is intact with photopolymerization, are each not particularly limited, but preferably in the range of from 10,000 to 200,000 for obtaining a relief layer having extremely excellent toughness.

The number average molecular weight ($\overline{Mn}$) for each of the prepolymer and the binder polymer as used herein is a value obtained using gel permeation chromatography (GPC) in which a calibration curve prepared using standard polystyrene is employed.

Representative examples of prepolymers include, an ethylenically unsaturated polyester, ethylenically unsaturated polyether, an ethylenically unsaturated polyurethane, an oligoester (meth)acrylate, an ethylenically unsaturated poly(meth)acrylate, a modified product thereof and an ethylenically unsaturated rubber compound.

The ethylenically unsaturated group is introduced into a polyester, a polyurethane, an oligoester(meth)acrylate, a poly(meth)acrylate, a modified product thereof and a rubber compound by the use of an ethylenically unsaturated compound having a carboxyl group, a hydroxyl group, an isocyanate group or the like.

Representative examples of ethylenically unsaturated polyesters include polyesters prepared by reacting an ethylenically unsaturated dibasic acid, such as maleic acid, fumaric acid, itaconic acid and anhydrides thereof, with a polyol (the terminology "polyol" used herein means an alcohol having two or more hydroxyl groups), such as ethylene glycol, propylene glycol, diethylene glycol, triethylene glycol, tetraethylene glycol, a polyalkylene glycol, glycerin, trimethylol propane, pentaerythritol, a 1,4-polybutadiene having terminal hydroxyl groups, a hydrogenated or non-hydrogenated 1,2-polybutadiene having terminal hydroxyl groups, a butadiene-styrene copolymer having terminal hydroxyl groups and a butadiene-acrylonitrile copolymer having terminal hydroxyl groups. Further, representative examples of ethylenically unsaturated polyesters include polyesters obtained by substituting portions of the acid components of the above-mentioned unsaturated polyesters individually with a saturated polybasic acid ("polybasic acid" used herein includes a dibasic acid also), such as succinic acid, adipic acid, phthalic acid, isophthalic acid, phthalic anhydride and trimellitic acid. Representative examples of modified ethylenically unsaturated polyesters include alkyd resins obtained by modifying the above-mentioned polyesters with a drying oil fatty acid or semi-drying oil fatty acid.

Representative examples of ethylenically unsaturated polyurethanes include ethylenically unsaturated polyurethanes having addition-polymerizable unsaturated groups introduced by utilizing terminal isocyanate and/or hydroxyl groups of the polyurethanes derived from at least one polyol and at least one polyisocyanate. For example, such unsaturated polyurethanes may be produced from (i) a polyurethane having terminal isocyanate and/or hydroxyl groups as prepared from at least one polyol, and at least one polyisocyanate, the polyol being, for example, a polyol as mentioned above; a polyester polyol, such as polycaprolactone diol, polyvalerolactone diol, polyethylene adipate diol or polypropylene adipate diol; a polyether polyol, such as polyoxyethylene glycol, polyoxypropylene glycol, polyoxyethyleneoxypropylene glycol or polyoxytetramethylene glycol; or a polymer polyol, such as 1,4-polybutadiene having terminal hydroxyl groups, a hydrogenated or non-hydrogenated 1,2-polybutadiene having terminal hydroxyl groups, a butadiene-styrene copolymer having terminal hydroxyl groups or a butadiene-acrylonitrile copolymer having terminal hydroxyl groups, and the polyisocyanate being, for example, tolylene diisocyanate, diphenylmethane-4,4'-diisocyanate, hexamethylene diisocyanate, naphtylene-1,5-diisocyanate, xylylene diisocyanate, isophorone diisocyanate or a polymethylenepolyphenyl isocyanate and (ii) at least one unsaturated polybasic acid as mentioned above or its ester or polyester having active hydrogen atoms derived from hydroxyl (reactive with the terminal isocyanate) and/or carboxyl (reactive with both of the terminal isocyanate and the terminal hydroxyl) and/or amino groups (reactive with the terminal isocyanate), such as alkylene glycol mono(meth)acrylate, polyoxyalkylene glycol mono(meth)acrylate, allyl alcohol, aminoalkyl methacrylate, and unsaturated polyurethanes obtained by linking two or more molecules of an unsaturated polyester as mentioned above with a polyisocyanate.

Representative examples of ethylenically unsaturated polyethers include an ethylenically unsaturated ester prepared by reacting a polyether glycol, such as a polyoxyethylene glycol, a polyoxypropylene glycol, a polyoxyethyleneoxypropylene glycol or a polyoxytetramethylene glycol with (meth)acrylic acid.

Representative examples of oligoester (meth)acrylates include oligoester (meth)acrylates obtained by the co-condensation of an esterification reaction system composed of a polybasic acid or its anhydride and a polyol with acrylic acid and/or methacrylic acid. The oligoester (meth)acrylate preferably has a number average molecular weight of about 500 to about 5,000. The number average molecular weight can be controlled by choosing an appropriate molar ratio of the raw materials. Representative examples of polybasic acids or anhydrides thereof include adipic acid, isophthalic acid, phthalic acid and anhydrides thereof. Representative examples of polyols include ethylene glycol, propylene glycol, diethylene glycol, triethylene glycol, tetraethylene glycol, glycerin, trimethylolpropane and pentaerythritol. Representative examples of oligoester (meth)acrylates also include epoxy(meth)acrylates, for example, esters of acrylic acid or methacrylic acid and compounds having epoxy groups obtained by condensation polymerization of a polyol or polyhydric phenol ("polyhydric phenol" used herein means a phenol having two or more hydroxyl groups) with epichlorohydrin or an alkylene oxide, and also include polymers having, in its side chains, carbon-carbon double bonds capable of taking an active part in the addition polymerization reaction, for example, polymers obtained by reacting an unsaturated carboxylic acid or its anhydride with a polymer having hydroxyl groups such as polyvinyl alcohol or cellulose, polymers obtained by esterifying a homopolymer or copolymer of acrylic acid or methacrylic acid having carboxyl groups with an unsaturated alcohol, such as allyl alcohol, glycidyl acrylate or glycidyl methacrylate, polymers obtained by reacting a copolymer containing maleic anhydride monomer units with allyl alcohol, a hydroxyalkyl acrylate and/or a hydroxyalkyl methacrylate, and polymers obtained by reacting a copolymer having glycidyl acrylate and/or glycidyl methacrylate monomer units with acrylic acid and/or methacrylic acid.

Representative examples of ethylenically unsaturated poly(meth)acrylates include unsaturated poly(meth)acrylates obtained by reacting a (meth)acrylic resin which is a copolymer comprising monomer units having a carboxyl group, monomer units having a hydroxyl group and/or monomer units having a glycidyl group with an ethylenically unsaturated compound having a functional group reactive with the above-mentioned functional groups of the copolymer, such as unsaturated poly(meth)acrylates obtained by addition reaction of a copolymer of (meth) acrylic acid with at least one member selected from the group consisting of a (meth)acrylate, styrene and vinyl acetate, with glycidyl (meth)acrylate; and unsaturated poly(meth)acrylates obtained by addition reaction of a copolymer containing glycidyl (meth)acrylate units with (meth) acrylic acid.

Representative examples of ethylenically unsaturated rubbers include a polymer (I) selected from the group consisting of 1,4-polybutadiene, 1,2-polybutadiene, a copolymer of butadiene and styrene, a copolymer of butadiene and acrylonitrile and an EPDM; a copolymer of isobutylene and isoprene; and a modified rubber having an ethylenically unsaturated group which may be obtained by introducing an ethylenically unsaturated group into the above-mentioned member (I).

With respect to the modified rubber, introduction of an ethylenically unsaturated group into polymer (I) may be effectively carried out by using a rubber of varied kind having a functional group at its chain terminal.

Representative examples of binder polymers include a water-soluble polyamide, an alcohol-soluble polyamide, a cellulose derivative, a polyvinyl acetate, a polyvinyl acetate derivative, water-soluble polyamide ether, a polyvinyl pyrrolidone, a water-soluble polyamideimide, a homopolymer or copolymer containing (meth)acrylic acid units, a thermoplastic linear polyurethane and a rubber-like compound.

Representative examples of water-soluble polyamides include a polyamide having a sulfonic acid group or a sulfonate group obtained using sodium 3,5-dicarboxybenzenesulfonate (see U.S. Pat. No. 3,884,702); a polyamide having an ether bond obtained using at least one member selected from the group consisting of a dicarboxylic acid having an ether bond, a diamine having an ether bond and a cyclic amide having an ether bond (see Japanese Patent Application Laid-Open Specification No. 49-43565); a polyamide having a basic nitrogen obtained using N,N'-di(γ-aminopropyl)piperadine and a polyamide obtained by quaternizing the above-mentioned polyamide having a basic nitrogen with acrylic acid or the like (see U.S. Pat. No. 4,145,222); and a polyamide having a polyether segment having a number average molecular weight of from 150 to 1,500, a polyamide obtained by ring opening polymerization of α-(N,N'-dialkylamino)-ε-caprolactam and a polyamide obtained by ring opening copolymerization of α-(N,N'-dialkylamino)-ε-caprolactam and ε-caprolactam (see U.S. Pat. No. 4,323,639).

Representative examples of cellulose derivatives include a half ester of cellulose acetate with succinic acid.

Representative examples of alcohol-soluble polyamides include a polyamide obtained by polycondensation of ε-caprolactam with hexamethylenediamine adipate (see U.S. Pat. No. 3,787,211).

Representative examples of polyvinyl acetate derivatives include a partially saponified polyvinyl acetate derivative, an ethylene oxide adduct of a polyvinyl acetate and a partially saponified ethylene oxide adduct of polyvinyl acetate.

Representative examples of water-soluble polyamide ethers include a water soluble polyamide obtained by linking a polycondensate of adipic acid with ε-caprolactam and a polyethylene glycol or a polytetramethylene glycol through an ester bond or a urethane bond.

Representative examples of water-soluble polyamideimides include a water-soluble polyamideimide obtained by linking a polycondensate of trimellitic acid with ε-caprolactam and a polyethylene glycol or a polytetramethylene glycol through an ester bond or a urethane bond.

Representative examples of copolymers containing (meth)acrylic acid units include a copolymer of acrylic acid with methacrylic acid, a copolymer of acrylic acid with maleic acid, maleic anhydride, styrene or a mixture thereof and a copolymer of methacrylic acid with maleic acid, maleic anhydride, styrene or a mixture thereof.

Representative examples of thermoplastic linear polyurethanes include a polyurethane which is the same polyurethane as the above-mentioned ethylenically unsaturated polyurethane prior to the introduction of the ethylenically unsaturated group.

Representative examples of rubber-like compounds include a hydrogenated 1,2-polybutadiene, a hydrogenated 1,4-polybutadiene and a copolymer of ethylene with propylene.

Examples of ethylenically unsaturated monomers which are used as component (B) of the photosensitive resin composition of the present invention, include the following known ethylenically unsaturated monomers:

(1) unsaturated carboxylic acids and esters thereof, such as acrylic acid and methacrylic acid, alkyl acrylate, alkyl methacrylate, cycloalkyl acrylate, cycloalkyl methacrylate, alkyl halide acrylate, alkyl halide methacrylate, alcoxyalkyl acrylate, alcoxyalkyl methacrylate, hydroxyalkyl acrylate, hydroxyalkyl methacrylate, aminoalkyl acrylate, aminoalkyl methacrylate, tetrahydrofurfuryl acrylate, tetrahydrofurfuryl methacrylate, allyl acrylate, allyl methacrylate, glycidyl acrylate, glycidyl methacrylate, benzyl acrylate, benzyl methacrylate, phenoxy acrylate, phenoxy methacylate, mono- or di-acrylate of alkylene glycol, mono- or di-methacrylate of alkylene glycol, mono- or diacrylate of polyoxyalkylene glycol, mono- or dimethacrylate of polyoxyalkylene glycol, trimethylolpropane triacrylate, trimethylolpropane trimethacrylate, pentaerythritol tetraacrylate, and pentaerythritol tetramethacrylate;

(2) acrylamides, methacrylamides and derivatives thereof, such as an acrylamide N-substituted with an alkyl or hydroxyalkyl group, a methacrylamide N-substituted with an alkyl or hydroxyalkyl group, an acrylamide N,N'-disubstituted with alkyl and/or hydroxyalkyl groups, a methacrylamide N,N'-disubstituted with alkyl and/or hydroxyalkyl groups, diacetone acrylamide, diacetone methacrylamide, N,N'-alkylene-bis-acrylamide, and N,N'-alkylene-bismethacrylamide;

(3) allyl compounds, such as allyl alcohol, allyl isocyanate, diallyl phthalate and triallyl cyanurate;

(4) maleic acid, maleic anhydride, fumaric acid, and esters thereof, mono- or di-alkyl maleate, mono- or di-alkyl fumarate, mono- or di-haloalkyl maleate, mono- or di-haloalkyl fumarate, mono- or di-alkoxyalkyl maleate, and mono- or di-alkoxyalkyl fumarate; and (5) other unsaturated compounds, such as styrene, vinyltoluene, divinylbenzene, N-vinylcarbazole and N-vinyl-pyrrolidone.

When these compounds are employed in combination, an azide compound may be incorporated into the ethylenically unsaturated monomers. As such an azide compound, there may be mentioned 4,4'-diazidostilbene, p-phenylenebisazide, 4,4'-diazidobenzophenone, 4,4'-diazidophenylmethane, 4,4'-diazidochalcone, 2,6-di(4'-azidobenzal)-cyclohexanone, 4,4'-diazidostilbene-α-carboxylic acid, 4,4'-diazidodiphenyl, a disodium salt of 4,4'-diazidostilbene-2, 2'-disulfonic acid and the like.

These ethylenically unsaturated monomers may be used individually or in combination.

There is no particular limitation with respect to the molecular weight [the number average molecular weight when the ethylenically unsaturated monomer is an oligoester (meth)acrylate] of the ethylenically unsaturated monomer. However, the ethylenically unsaturated monomer preferably has a molecular weight of less than 2,000. The number average molecular weight of an oligoester (meth)acrylate is measured in substantially the same manner as described with respect to the polymer (A).

The weight ratio of the prepolymer and/or the binder polymer [component (A)] to the ethylenically unsaturated monomer [component (B)] is within the range of from 98.0/1.0 to 5.0/94.0, preferably from 95.0/4.0 to 20.0/79.0, more preferably from 80.0/19.0 to 30.0/47.0.

Hindered amine (C) as a light stabilizer has a piperidine ring represented by the formula (I):

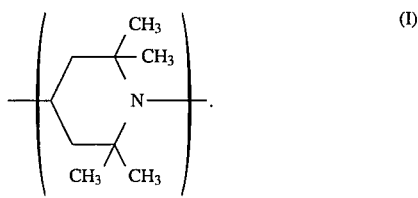

As an atom or a group which is bonded to the nitrogen atom in the piperidine ring of hindered amine (C), there may be mentioned a hydrogen atom, and a straight or branched chain alkyl group having 1 to 20 carbon atoms which may be substituted or unsubstituted. Further, as a substituent at the 4-position of the ring, there may be mentioned an oxygen-containing group or a nitrogen-containing group.

Hindered amine (C) has 1 or more (about 10) piperidine rings represented by formula I in its molecule, and may be a monomer or an oligomer. When hindered amine (C) is an oligomer, it is preferred that it have a number average molecular weight not greater than 5,000 from the viewpoint of compatibility with components (A) and (B).

Representative examples of hindered amines include bis(1,2,2,6,6-pentamethyl-4-piperidyl)sebacate represented by the formula:

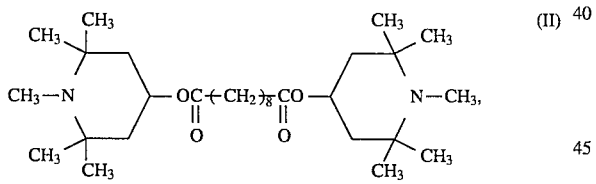

bis(2,2,6,6-tetramethyl-4-piperidyl)sebacate represented by the formula:

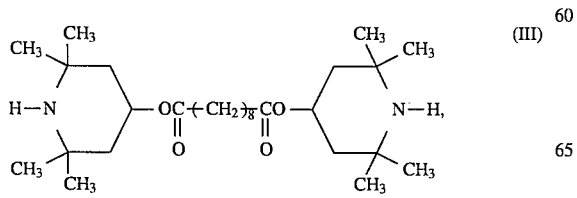

bis(1,2,2,6,6-pentamethyl-4-piperidyl)-2-(3,5-di-t-butyl-4-hydroxybenzyl)-2-n-butyl malonate represented by the formula:

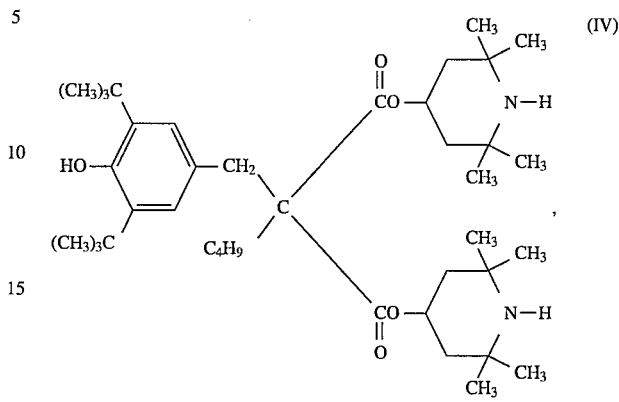

a polycondensate of dimethyl-1-(2-hydroxyethyl)-4-hydroxy-2,2,6,6-tetramethylpiperidine succinate represented by the formula:

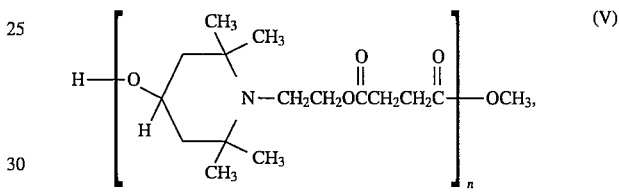

a poly [6-(1,1,3,3-tetramethylbutyl)imino-1,3,5-triazin-2,4-diyl][(2,2,6,6-tetramethyl-4-piperidyl)imino]hexamethylene[(2,2,6,6-tetramethyl-4-piperidyl)imino] represented by the formula:

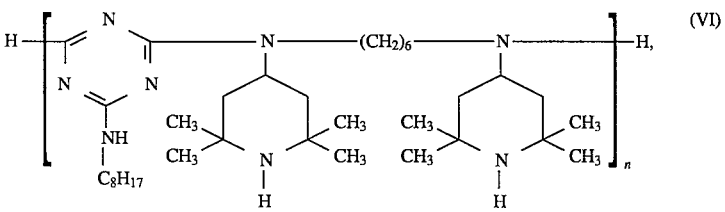

tetrakis(2,2,6,6-tetramethyl-4-piperidyl)-1,2,3,4-butanetetracarboxylate represented by the formula:

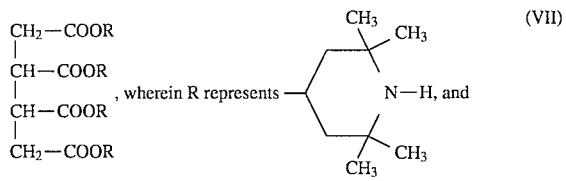 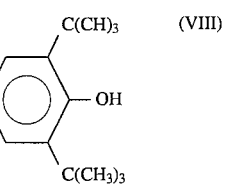 (VII)

, wherein R represents 1-2-[3-(3,5-di-t-butyl-4-hydroxyphenyl)propionyloxy]
ethyl-4-[3-(3,5-di-t-butyl-4-hydroxyphenyl)-propionyloxy]-
2,2,6,6-tetramethylpiperidine represented by the formula:

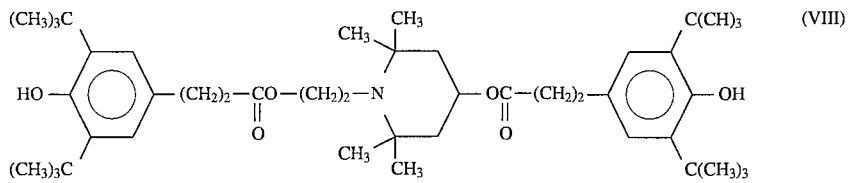 (VIII)

These hindered amines may be used individually or in combination. The amount of the hindered amine is generally in the range of from 0.05 to 10.0% by weight, preferably from 0.1 to 8.0% by weight, based on the total weight of components (A), (B), (C) and (D). When the amount is less than 0.05% by weight, the light stabilizing effect of the hindered amine is insufficient. On the other hand, when the amount exceeds 10% by weight, not only does the compatibility of the hindered amine with polymer (A) of the composition of the present invention become poor, but also the composition becomes expensive, leading to an economical disadvantage.

Various photopolymerization initiators as customarily used can be employed as component (D) of the photosensitive resin composition of the present invention. Representative examples of photopolymerization initiators include benzoin, benzoin methyl ether, benzoin ethyl ether, benzoin n-propyl ether, benzoin isopropyl ether, benzoin n-butyl ether, benzoin isobutyl ether, 2,2-dihydroxy-2-phenylacetophenone, 2,2-dimethoxy-2-phenylacetophenone, 2,2-diethoxy-2-phenylacetophenone, 2,2-diethoxyacetophenone, benzophenone, 4,4-bisdialkylaminobenzophenone, 4-dimethylaminobenzoic acid, alkyl 4-dimethylaminobenzoate, 2-ethylanthraquinone, xanthone, thioxanthone and 2-chlorothioxanthone. These photopolymerization initiators may be used individually or in combination. The amount of the photopolymerization initiator is generally in the range of from 0.001 to 10.0% by weight, preferably from 0.01 to 10.0% by weight, more preferably from 0.1 to 5.0% by weight, based on the total weight of components (A), (B), (C) and (D).

In the photosensitive resin composition, when components (A), (B), (C) and (D) each contains in its structure a segment having ether bonds which is represented by the formula:

$$-(R^1-O)_n-$$ (IX)

wherein $R^1$ represents a divalent hydrocarbon group having from 2 to 20 carbon atoms, and n is an integer of 3 or more, the light stabilization effect to be attained by the present invention is promoted.

Representative examples of divalent hydrocarbon groups having from 2 to 20 carbon atoms include an alkylene group, a phenylene group and an aralkylene group.

In formula (IX), n is preferably an integer of from 5 to 50.

Representative examples of segments include those of a polyoxyethylene polyol, a polyoxypropylene polyol, a polyoxytetramethylene polyol, a polycarbonate polyol and a polyphenylene ether polyol.

As mentioned above, each of components (A), (B), (C) and (D) of the photosensitive resin composition may contain in its structure the segment having ether bonds. However, when at least one of components (A) and (B) contains in its structure the segment having ether bonds and the segment is present in an amount of 50% or more by weight based on the total weight of components (A) and (B), particularly preferred results are obtained.

The content of the segment having ether bonds of components (A) and (B) is measured for example, by the following method.

By a customary chemical decomposition method, bonds other than ether bonds, such as an ester bond, an amide bond and a urethane bond in the molecular chains of components (A) and (B) are broken. Then, the segments having ether bonds are isolated from the other decomposed segments, e.g., by extraction. The weight of the isolated segments is determined, and the content of the segment having ether bonds is calculated by the following formula.

Content of the segment having ether bonds of components (A) and (B) = $\frac{\text{weight of isolated segments}}{\text{total weight of components (A) and (B)}} \times 100\ (\%)$ Representative examples of customary chemical decomposition methods include a decomposition method using hydrazine, a decomposition method using hydrogen bromide and a decomposition method using methylamine.

Whether or not the segments having ether bonds have substantially been isolated e.g., by extraction may be confirmed by GPC method, nuclear magnetic resonance (NMR) method or the like.

When the content of the segment having ether bonds of each of components (A) and (B) is measured separately, each of components (A) and (B) is isolated from a composition using GPC and then the content of the segment having ether bond of each of components (A) and (B) is measured separately.

Representative examples of prepolymers as component (A) which contain in their structures the segment having ether bonds include an unsaturated polyetherpolyester, an unsaturated polyetherpolyurethane, an unsaturated polyetherpolyesterpolyurethane, an oligoetherester (meth)acrylate and an unsaturated polyether. Representative examples of binder polymers as component (A) which contain in their structures the segment having ether bonds include a polyamide ether, a polyamideimide ether and an adduct of a polyvinyl acetate with ethylene oxide.

Representative examples of ethylenically unsaturated monomers as component (B) which contain in their structures the segment having ether bonds include a polyoxyalkylene glycol mono-(meth)acrylate, a polyoxyalkylene glycol di-(meth)acrylate and a polyoxyalkylene glycol mono-(meth)acrylate having at its terminal an alkoxy group, such as a methoxy group or an ethoxy group, or a phenoxy group.

The ether bond content of any component can be measured by conventional techniques.

In addition to the above-mentioned essential components (A), (B), (C) and (D), the photosensitive resin composition of the present invention may contain a heat-polymerization inhibitor. The use of the heat-polymerization inhibitor contributes to improvement in the storage stability of the photo sensitive resin composition.

Representative examples of heat-polymerization inhibitors include hydroquinone, mono-tert-butyl-hydroquinone, benzoquinone, 2,5-diphenyl-p-benzoquinone, picric acid, di-p-fluorophenylamine, p-methoxyphenol, and 2,6-di-tert-butyl-p-cresol. These heat-polymerization inhibitors may be used individually or in combination. The heat-polymerization inhibitors are added for preventing heat-polymerization reactions (reactions occurring even in the darkness), which contributes to improvement in storage stability of the composition. The amount of the heat-polymerization inhibitor is such as will be effective for inhibiting heat-polymerization, i.e., from 0.01 to 5.0% by weight, based on the total weight of components (A), (B), (C) and (D). When the amount of the heat-polymerization inhibitor is less than 0.01% by weight, the effect aimed at by the use of the heat-polymerization inhibitor is insufficient, that is, improvement in storage stability of the photosensitive resin composition is insufficient. On the other hand, when the amount exceeds 5% by weight, the curing time of the photosensitive resin composition disadvantageously becomes too long.

The photosensitive resin composition of the present invention may, if desired, further contain an ultraviolet absorber, a dye, a pigment, an organic filler, a lubricant and a surfactant as long as such additives do not impair or effect the object of the present invention. For example, a fatty acid, a fatty amide or a dialkyl thiodipropionate may be added to the photosensitive resin composition in order to improve surface properties, such as wetting properties and low surface tack; and mechanical strengths, such as flexibility.

When the photosensitive resin composition contains carboxyl groups in too large an amount, i.e., the composition has an acid value as large as 20 or more, a large amount of hindered amine (C) is likely to react with the carboxyl groups, leading to a decrease in photodeterioration preventing effect. Accordingly, it is desirable to neutralize the carboxyl groups with an amine prior to mixing a carboxyl group-containing component of the composition with hindered amine (C). There is no particular limitation with respect to the type of amine for the neutralization. However, a triethanolamine or N,N-dimethylamine is generally used as the amine.

The method for preparing the photosensitive resin composition of the present invention is not critical, and the present photosensitive resin composition may be readily prepared from components (A), (B), (C) and (D), optionally together with additives as mentioned above, according to customary procedures.

For example, a liquid photosensitive resin composition may be prepared according to the following procedure. First, components (A), (B), (C) and (D), optionally together with additives, are charged into a vessel. The contents of the vessel are then heated at a temperature of about 70° to 120° C. for a period of about 1 to 2 hours while stirring, until the contents become homogeneous. The vessel is allowed to stand still in a vacuum oven heated at about 40° to 50° C. for a period of 1 or 2 days to thereby attain defoaming of the contents. Thus, the desired composition is obtained.

On the other hand, a solid photosensitive resin composition may be prepared for example, according to the following procedure. Components (A), (B), (C) and (D), optionally together with additives, are charged into a kneader, such as Brabender mixer. In the kneader, the whole charged is kneaded at a temperature of about 100° to 150° C. for a period of about 0.5 to 1.5 hours. Alternatively, components (A), (B), (C) and (D), optionally together with additives, are dissolved in a solvent, mixed at a temperature of about 60° to 110° C. for a period of about 1 to 2 hours until a homogeneous solution is obtained, and subjected to solvent evaporation. Then, the mixture obtained after kneading or solvent evaporation is sandwiched between polyester films, and compressed at a temperature of about 100° to 150° C. under a pressure of about 100 to 200 kg/cm², using a press machine. The composition can have a predetermined thickness by the use of a spacer at the time of compression.

The composition of the present invention is particularly useful for the production of a relief printing plate having excellent printing resistance.

Accordingly, in another aspect of the present invention, there is provided a method for producing a relief printing plate which comprises the steps of:

(a) providing a photosensitive resin layer, then in either order for exposure;

(b) subjecting one surface of said resin layer to relief exposure through a transparency having a transmitting pattern, and (c) subjecting the other surface of said resin layer to back exposure;

(d) subjecting the resultant exposed resin layer to development to obtain a relief printing plate;

(e) washing said relief printing plate; and (f) drying the washed relief printing plate; wherein said photosensitive resin layer is composed of a photosensitive resin composition comprising:

(A) from 5.0 to 98.0% by weight, based on the total weight of components (A), (B), (C) and (D), of a polymer selected from the group consisting of a prepolymer, a binder polymer and mixture thereof, (B) from 1.0 to 94.0% by weight, based on the total weight of components (A), (B), (C) and (D), of an ethylenically unsaturated monomer, (C) from 0.05 to 10.0% by weight, based on the total weight of components (A), (B), (C) and (D), of a hindered amine having a piperidine ring represented by the formula:

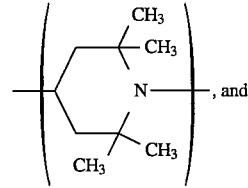

(D) from 0.001 to 10.0% by weight, based on the total weight of components (A), (B), (C) and (D), of a photopolymerization initiator.

The method for preparing a relief printing plate will now be described.

As mentioned above, the photosensitive resin composition of the present invention may be a liquid or solid.

First, a method for preparing a relief printing plate using a liquid photosensitive resin composition is described.

This method comprises the steps of (1) lamination, (2) masking exposure, (3) relief exposure, (4) back exposure, (5) removal of the uncured resin composition (development), (6) washing, (7) post exposure in water and (8) drying. If desired, masking exposure step (2) may be omitted. However, when a relief printing plate having a thickness of 4 mm or more is intended, it is desirable to conduct masking exposure step (2).

When masking exposure step (2) is omitted, the sequence of relief exposure step (3) and back exposure step (4) may be either in this order or reverse order.

When masking exposure step (2) is involved in the method, the sequence of masking exposure step (2), relief exposure step (3) and back exposure step (4) may be in any order, provided that masking exposure step (2) is conducted prior to relief exposure step (3).

Figure 2:
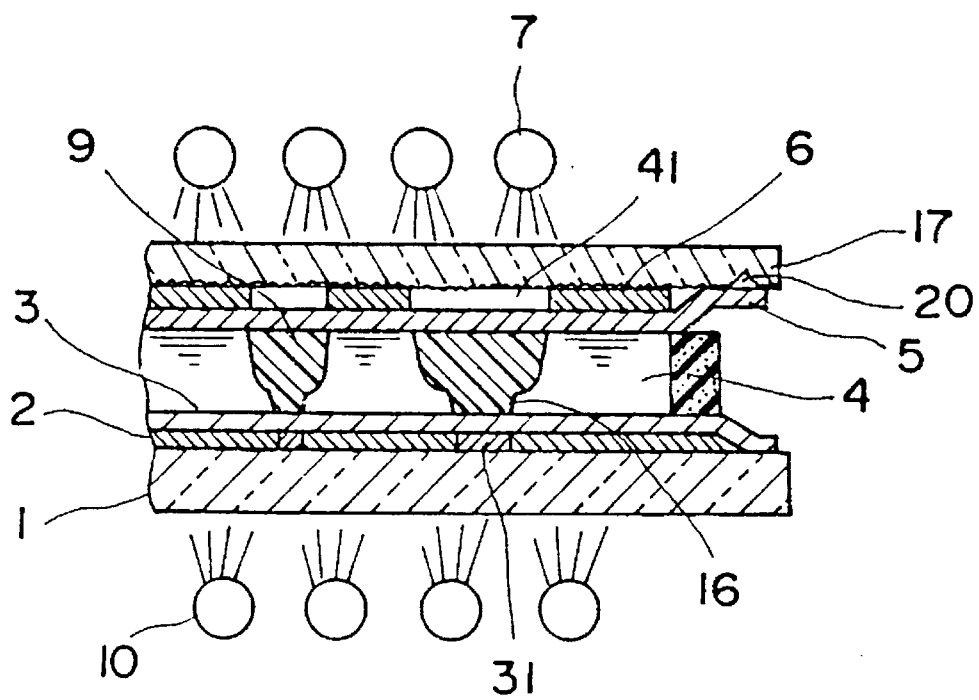
Figure 3:
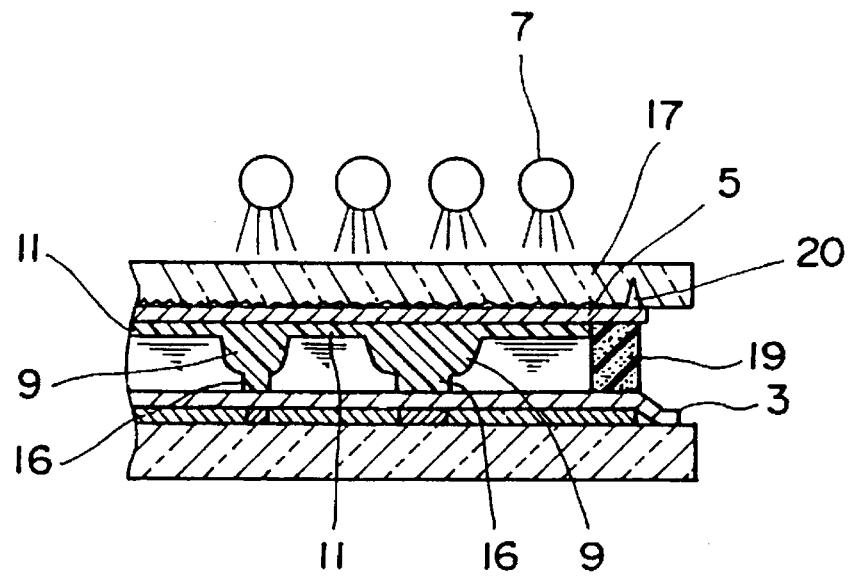

Referring to FIGS. 1 to 4, a brief explanation is provided below with respect to one mode or method for preparing a relief printing plate in which the masking exposure is involved as a representative example. FIG. 1 is a diagrammatic cross-sectional view of a laminated structure which is to be subjected to masking, relief and back exposures, FIG. 2 is a diagrammatic cross-sectional illustration showing an arrangement employed for effecting the masking exposure and the relief exposure, and FIG. 3 is a diagrammatic cross-sectional illustration showing an arrangement employed for effecting the back exposure.

(1) Lamination [FIG. 1]

Image bearing transparency 2 is disposed on lower rigid plate 1 transparent to actinic rays, such as a glass plate, which in turn is covered with thin transparent protective film 3. On the upper surface of protecting film 3 along its periphery is formed sponge dam 19. In the cavity formed by sponge dam 19, a liquid photosensitive resin composition is poured. Transparent substrate 5, such as a polyester film having a thickness of 0.1 to 0.2 mm, is laminated on the poured resin composition by a roll laminating method, while simultaneously levelling the resin composition into layer 4 with a predetermined thickness by applying a pressure to the resin composition by means of the roller used in the laminating method.

On substrate 5 laminated on liquid photosensitive resin composition layer 4 having the predetermined thickness, is superposed masking film 6 having a transmitting pattern 41 having a contour which corresponds to and is slightly larger than that of the transmitting pattern of the image bearing transparency so that the position of the transmitting pattern of the masking film is in correspondence with the position of the transmitting pattern of the image bearing transparency. The masking film comprises a transparent film generally having a thickness of 75 to 200 µm with a light-shielding thin film disposed thereon, wherein portions of the thin film which correspond to the desired pattern are cut out to form a transmitting pattern.

(2) Masking exposure [FIG. 2]

An upper light source box positioned above substrate 5 which contains upper light source 7 and whose bottom opening has upper rigid plate 17 which is transparent to the actinic rays, such as a glass plate, and extends over the bottom opening, is pulled down, so that upper rigid plate 17 is superposed on masking film 6. The lower surface of upper rigid plate 17, which faces the masking film, is in a roughened state and has groove 20 provided thereon along the periphery. Groove 20 and the clearance formed between the roughened lower surface of upper rigid plate 17 and masking film 6 is evacuated in order to attract masking film 6 and substrate 5 toward upper rigid plate 17, causing masking film 6 and the substrate to be pressed against upper rigid plate 17. This procedure is employed in order to secure the flatness of each of masking film 6 and substrate 5, thereby serving to produce a printing plate having a uniform thickness and which is free from dents and bumps. The layer of the resin composition is then exposed to actinic rays, such as ultraviolet rays, through the transmitting pattern of masking film 6, thereby selectively curing the layer of the resin composition to form shelf portion 9 which is to be a support for relief portion 16 which is later formed.

(3) Relief exposure [FIG. 2]

After the masking exposure, the layer of the resin composition is exposed to actinic rays which are emitted from lower light source 10 through the transmitting pattern 31 (image pattern) of the image bearing transparency to form relief portion 16.

(4) Back exposure [FIG. 3]

After the relief exposure, the upper light source box is lifted and masking film 6 is removed. Then the upper light source box is lowered, and the layer of the resin composition is exposed for a short period of time to actinic rays which are emitted from upper light source 7 to form a thin cured layer of resin composition 11 having a uniform thickness in the resin layer over the entire area facing substrate 5. Thin cured layer of resin composition 11 thus formed by the back exposure will be hereinafter referred to as "back layer".

(5) Removal of the uncured resin composition After the back exposure, the uncured resin composition is recovered.

(6) Washing

Figure 4:
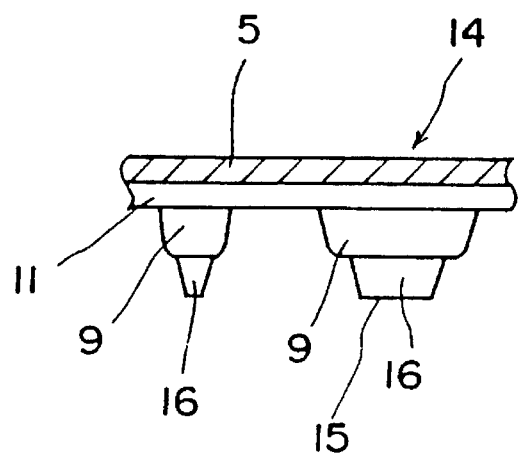
FIG. 4 shows a cross-section of a printing plate obtained by the above-described process.

The uncured resin composition remaining is washed out by nozzle washing or brush washing using a wash-out solution, thereby obtaining washed-out plate 14 as shown in FIG. 4.

(7) Post-exposure in water

The thus obtained plate 14 is completely immersed in water and exposed to actinic rays such as ultraviolet rays which are emitted from a light source to perform a complete curing of the entire plate so that the strength of the plate is increased.

(8) Drying

Plate 14 is removed from the water and dried by blowing the plate with hot air or by the use of an infrared heater.

The thus obtained printing plate 14 has such a construction as shown in FIG. 4. In FIG. 4, numeral 16 designates the relief portion which has been formed by the relief exposure, numeral 15 the surface of the relief portion on which a printing ink is to be applied, numeral 9 the shelf portion which has been formed by the masking exposure, numeral 11 the back layer which has been formed by the back exposure, and numeral 5 the substrate.

Another mode or method for producing a relief printing plate using a liquid photosensitive resin composition in which the masking exposure is not involved is described below.

The method comprises the following steps (1') to (7').

(1') Lamination

An image bearing transparency is disposed on a lower rigid plate transparent to actinic rays, such as a glass plate, which in turn is covered with a thin transparent protective film. On the upper surface of protecting film along its periphery is formed sponge dam. In the cavity formed by sponge dam, a liquid photosensitive resin composition is poured. A transparent substrate, such as a polyester film having a thickness of 0.1 to 0.2 mm, is laminated on the poured resin composition by a roll laminating method, while simultaneously levelling the resin composition into a layer with a predetermined thickness by applying a pressure to the resin composition by means of the roller used in the laminating method.

(2') Back exposure

After the lamination, the layer of the resin composition is exposed for a short period of time to actinic rays which are emitted from an upper light source to form thin cured layer of the resin composition having a uniform thickness in the resin layer over the entire area facing substrate. The thin cured layer of the resin composition thus formed by the back exposure will be hereinafter referred to as "back layer".

(3') Relief exposure

After the back exposure, the layer of the resin composition is exposed to actinic rays which are emitted from a lower light source through the transmitting pattern (image pattern) of the image bearing transparency to form relief portion.

(4') Removal of the uncured resin composition

After the relief exposure, the uncured resin composition is recovered.

(5') Washing

The uncured resin composition remaining is washed out by nozzle washing or brush washing using a wash-out solution, thereby obtaining a washed-out plate.

(6') Post-exposure in water

The thus obtained plate is completely immersed in water and exposed to actinic rays such as ultraviolet rays which are emitted from a light source to perform a complete curing of the entire plate so that the strength of the plate is increased.

(7') Drying

The plate is removed from the water and dried by blowing the plate with hot air or by the use of an infrared heater.

Next, one mode or method for producing a relief printing plate using a solid photosensitive resin composition is described below.

In a method for producing a relief printing plate using a solid photosensitive resin composition, masking exposure and recovery of uncured resin composition are not generally involved.

Consequently, the method comprises the following steps (1") to (6").

(1") Sheet forming

A spacer is placed on a transparent substrate (e.g., a polyester film). A solid photosensitive resin composition is placed on the transparent substrate inside the spacer. A polyester film is placed on the photosensitive resin composition, thereby sandwiching the resin composition between the transparent substrate and the polyester film. The resultant sandwich is heat-pressed to form a sheet.

(2") Back exposure

The sheet is placed on a lower rigid plate which is transparent to actinic rays which are emitted from a lower light source located below the lower rigid glass plate in such a manner that the transparent substrate faces a lower rigid plate. The sheet is exposed for a short period of time to actinic rays which are emitted from the lower light source to form a thin cured layer of resin composition over the entire area facing the transparent substrate.

(3") Relief exposure

After the back exposure, the sheet is taken up from the glass plate and the polyester film is peeled off. An image bearing transparency is placed on the lower rigid substrate. The sheet is placed on the image bearing transparency in a manner such that the side of the sheet from which the polyester film has been peeled off faces the image bearing transparency. The sheet is exposed to actinic rays which are emitted from the light source through a transmitting pattern (image pattern) of image bearing transparency of the negative film to form a relief portion.

(4") Washing

The unreacted resin composition is washed out with water or a solvent.

(5") Drying

After the washing, the thus obtained plate is dried.

(6") Post-exposure

The plate is exposed to actinic rays to cure the back layer completely.

In this method, the relief exposure step (3") may be conducted prior to the back exposure step (2").

In the above-mentioned methods for producing a relief printing plate, as a light source of actinic rays for the exposures, there may be used a high pressure mercury lamp, an ultra-high pressure mercury lamp, an ultraviolet fluorescent lamp, a carbon arc lamp or a xenon lamp. Intensity of actinic rays for the exposures may be appropriately selected depending upon a type of a lamp and a type of a photosensitive resin and is generally in the range of from about 0.5 to about 100 mW/cm$^2$. For example, when an ultraviolet fluorescent lamp is used, the intensity of actinic rays is in the range of from about 0.5 to 10 mW/cm$^2$. When a pressure mercury lamp is used, the intensity of actinic rays is in the range of from about 10 to about 50 mW/cm$^2$.

The periods for the masking exposure, the relief exposure, the back exposure and the post-exposure depend upon a type of a lamp, intensity of actinic rays and thickness of a printing plate to be produced. However, the total period for the exposures is generally several tens of minutes to 2 hours from the viewpoint of operational efficiency. For example, when a printing plate having a thickness of 7 mm is prepared using a liquid photosensitive resin composition and an ultraviolet fluorescent lamp at an actinic ray intensity of 2.0 mW/cm$^2$, the periods for the masking exposure, the relief exposure, the back exposure and the post-exposure are generally about 5 minutes, about 6 minutes, about 40 seconds and about 10 minutes, respectively. When a printing plate having a thickness of 5 mm is prepared using a solid photosensitive resin composition and an ultraviolet fluorescent lamp at an actinic ray intensity of 2.0 mW/cm$^2$, the periods for the back exposure, the relief exposure and the post-exposure are generally about 10 minutes, about 40 minutes and about 10 minutes, respectively.

Representative examples of image-bearing transparencies used for the formation of a relief include a negative or positive film which is the same type as that for use in a photographic process in which silver salt image is utilized, and a sheet or film which is substantially transparent to actinic rays, such as a plastic film, a plastic sheet, a glass sheet, a cellophane film, a cellophane sheet and a paper sheet, which has an image formed by masking the surface thereof by the use of a light-shielding film. Representative examples of washing liquids for washing out an uncured resin composition include water; an alcohol; acetone; benzene; toluene; chloroethane; chloroethylene; an aqueous alkali solution, such as an aqueous sodium hydroxide solution, an aqueous sodium carbonate solution, an aqueous sodium phosphate solution, an aqueous sodium tripolyphosphate solution, an aqueous sodium borate solution and an aqueous sodium silicate solution; and an aqueous solution of a surfactant.

The photosensitive resin composition of the present invention comprises a prepolymer and/or a binder polymer, an ethylenically unsaturated monomer, a specific hindered amine having a piperidine ring and a photopolymerization initiator in specific proportions, and the composition of the present invention is capable of providing a relief printing plate having excellent printing resistance. The use of the hindered amine light stabilizer contributes to excellent uniform mechanical strength throughout the entire thickness of a photorelief portion of a relief printing plate, thereby enabling production of a relief printing plate having excellent printing resistance. Moreover, when a prepolymer and/or a binder polymer [component (A)] and/or component (B) has a segment containing ether bonds in an amount of 50% by weight or more, the effect of photodeterioration-prevention during the preparation of a printing plate can be remarkably promoted.

The photosensitive resin composition of the present invention provides particularly excellent results, when it is used for preparing a relief printing plate having a thickness of 1 mm or more. Therefore, the photosensitive resin composition of the present invention is advantageously used for preparing a relief printing plate, particularly a relief printing plate having a large thickness, such as a relief printing plate for printing a corrugated board or stamping.

DETAILED DESCRIPTION OF PREFERRED EMBODIMENTS

The present invention will now be described in greater detail with reference to the following Reference Examples, Examples and Comparative Examples which should not be construed as limiting the scope of the present invention.

In Reference Examples, Examples and Comparative examples, the number average molecular weights of component (A) and the oligomer (meth)acrylate as component (B) are measured using the GPC as described above. The conditions for the measurement are as follows:

Apparatus: TRI ROTAR manufactured and sold by Japan Spectroscopic Corp., Ltd., Japan Column: TSK GEL GMHXL (7.8 mm in diameter and 300 mm in length) manufactured and sold by TOYO SODA MFG. CO., LTD., Japan; 2 columns are used Detector: Shodex RI SE-51 manufactured and sold by Showa Denko K. K., Japan Developer: Tetrahydrofuran (THF)

In the following Examples and Comparative Examples, a relief printing plate is prepared according to the method described in item (i) below. Further, the accelerated printing resistance before storage, accelerated printing resistance after storage and practical printing resistance of a relief printing plate and the transparency of a photosensitive resin composition are measured according to the methods respectively described in items (ii) to (v) below.

(i) Production of a relief printing plate:

In Examples 1 to 14 and 18 to 20 and Comparative Examples 1 to 8 and 12 to 14, a relief printing plate is produced according to the method as described hereinbefore, which comprises the steps of (1) lamination, (2) masking exposure, (3) relief exposure, (4) back exposure, (5) removal of the uncured resin composition, (6) washing, (7) post-exposure in water and (8) drying.

In Examples 15 to 17 and Comparative Examples 9 to 11, a relief printing plate is produced according to the method as described hereinbefore, which comprises the steps of (1') lamination, (2') back exposure, (3') relief exposure, (4') Removal of the uncured resin composition, (5') washing, (6') post-exposure in water and (7') drying.

Each of masking exposure (2), back exposures (4) and (2'), and relief exposures (3) and (3'), is conducted using an ultraviolet fluorescent lamp at an actinic ray intensity of 2.0 mW/cm$^2$. The periods of exposures are varied according to the thickness of the photocured layer (i.e., thickness of the relief printing plate minus the thickness of the support polyester fill.; the polyester films used in all the Examples and Comparative Examples have a thickness of 0.1 mm) to be obtained from the photosensitive resin composition. The periods (minutes) taken for masking exposure (2), for back exposures (4) and (2') and for relief exposures (3) and (3') are shown in Table 1 below with respect to each of the thicknesses of the relief printing plate. Each of the post-exposures in water (7) and (6') is conducted for 10 minutes using an ultraviolet sterilization lamp in combination with an ultraviolet fluorescent lamp at actinic ray intensities of 2.0 mW/cm$^2$ and 2.0 mW/cm$^2$, respectively.

TABLE 1

| Thickness of relief printing plate (mm) | period of back exposure (min) | period of relief exposure (min) | period of masking exposure (min) |
| --- | --- | --- | --- |
| 1 | ½ | 2 | — |
| 2 | ⅔ | 3 | — |
| 3 | ⅔ | 5 | — |
| 7 | ⅔ | 5 | 6 |

In washing (6) and washing (5'), a washing device (model 400-W, manufactured and sold by Asahi Kasei Kogyo K. K., Japan) is used and an aqueous solution comprising 2% by weight of APR W-4 and 2% by weight of APR W-7 (tradenames of nonion surfactants, produced and sold by Asahi Kasei Kogyo K. K., Japan) is used as a washing liquid.

With respect to Example 21 and Comparative Example 15 a relief printing plate is produced according to the method as mentioned before comprising the steps of (1") Sheet forming, (2") back exposure, (3") relief exposure, (4") washing, (5") drying and (6") post-exposure.

Back exposure (2"), relief exposure (3") and post-exposure (6") are conducted using an ultraviolet fluorescent lamp at an actinic ray intensity of 2.0 mW/cm$^2$ for 10 minutes, 40 minutes and 10 minutes, respectively.

In washing (4"), a brush-type developing processor (model 200-W, manufactured and sold by Asahi Kasei Kogyo K. K., Japan) is used as a washing device and water is used as a washing liquid.

(ii) Method for measuring an accelerated printing resistance before storage:

In order to determine whether or not a relief printing plate has excellent printing resistance, an accelerated printing resistance before storage of the relief printing plate is measured according to the following test method. Illustratively stated, a relief printing plate having a size of 15 cm×20 cm is fixed at its one side on a cylinder with a gum tape. Then, an iron shaft having a diameter of 30 mm is provided apart from the cylinder in such an arrangement that the axis of the iron shaft is in parallel with the axis of the cylinder and the distance between the iron shaft and the cylinder is 10 cm so that the relief portion of the relief printing plate is caused to beat the iron shaft when the cylinder is rotated. Then, the cylinder is rotated at 120 rpm for 500 rounds. After completion of the rotation, the breakage percentage of relief is calculated by the following formula:

Breakage percentage of relief (%)=A/B×100 wherein A stands for the area of portions of the top surface of the relief which were broken off from the printing plate, and B stands for the total area of the top surface of the relief before subjecting the printing plate to this test.

(iii) Method for measuring an accelerated printing resistance after storage:

In order to determine whether or not a relief printing plate maintains excellent printing resistance after storage for a prolonged period of time, the plate is examined according to the following method.

The relief printing plate is allowed to stand at 50° C. in an atmosphere of 80% relative humidity for one month. Then, the resultant plate is examined with respect to the accelerated printing resistance after storage according to the same method as described in above item (ii).

Figure 5:
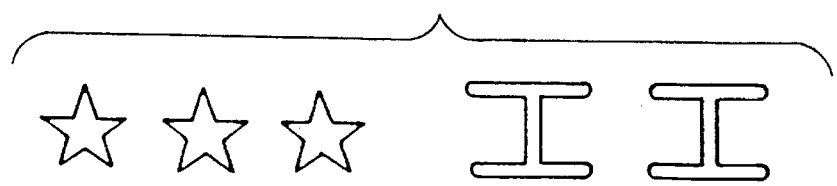
FIG. 5 shows a printing pattern used for the evaluation of practical printing resistance.

(iv) Method for measuring a practical printing resistance:

In order to confirm the printing resistance of a relief printing plate in a practical printing operation, a corrugated board-printing machine is set up with the relief printing plate having a size of 15 cm×20 cm and using the printing machine, 30,000 sheets of corrugated boards are printed under the conditions indicated below. The 30,000th printed corrugated board is observed, and the number of chipped portions corresponding to broken relief portions of the printing plate, in the printed pattern on the corrugated board is counted. The pattern used for the printing is illustrated in FIG. 5.

The Conditions for the Practical Printing

Printing machine: SHINKO FLEXO FORMING GLUER (TYPE FPM 1427 FSD) (anilox roll: #150) manufactured and sold by Shinko Kikai, Japan Ink: FK-88 (viscosity: Zahncup #4, 13 seconds) manufactured and sold by Sakata Inks, Japan Anilox roll pressure: 0.2 mm Printing pressure: 0.3 mm Printing speed: 150 sheets per minute (v) Transparency of a photosensitive resin composition:

Whether a photosensitive resin composition is transparent or turbid is examined as follows. That is, in Examples 1 to 20 and Comparative Examples 1 to 14, upon preparing a photosensitive resin composition, the composition is gently charged in a 20 ml-volume test tube so as not to entangle air bubble in the composition. Then, the composition in the test tube is subjected to visual observation. In Example 21 and Comparative Example 15, a photosensitive resin composition is subjected to press molding at 120° C. for 5 minutes to obtain a sheet having a size of 5 cm×5 cm×5 mm. Then, the sheet is subjected to visual observation.

The transparency of the composition can be utilized as a criterion for evaluating whether or not a hindered amine which is used as a light stabilizer is completely dissolved in the composition. That is, poor transparency of a composition means that the light stabilizer is not homogeneously dissolved in the composition.

In the tables given later, ○ means "transparent" and △ means "turbid".

REFERENCE EXAMPLE 1

Production of Prepolymer A

To a mixture of 1 mole of polypropylene glycol (as a diol, $\overline{Mn}$=2000) and 1 mole of polytetramethylene glycol (as a diol, $\overline{Mn}$=2000) are added 2.4 moles of tolylene diisocyanate (hereinafter referred to as "TDI") (2,4-isomer/2,6-isomer= 3/2) and 20 ppm by weight of dibutyltin laurate. The resultant mixture is heated at 80° C. for 3 hours to form a polymer having isocyanate groups at its both ends. To the resultant reaction mixture is added 2 moles of 2-hydroxypropyl methacrylate ($\overline{Mn}$=144). The mixture is heated at 80° C. to advance a reaction. The reaction is conducted until the absorbance at 2260 cm$^{-1}$ of the mixture as measured by infrared (IR) spectrophotometry, which absorbance is specific for an isocyanate group, becomes substantially zero. Thus, there is obtained an unsaturated polyurethane ($\overline{Mn}$=11,000; ether bond content: 85% by weight) (Prepolymer A).

REFERENCE EXAMPLE 2

Production of Prepolymer B

Substantially the same procedure as in Reference Example 1 is repeated except that 1.7 moles of polypropylene glycol (as a diol, $\overline{Mn}$=2000) and 0.3 mole of polyethylene adipate (as a diol, $\overline{Mn}$=2000) are used instead of 1 mole of polypropylene glycol and 1 mole of polytetramethylene glycol. Thus, there is obtained an unsaturated polyurethane ($\overline{Mn}$=11,000; ether bond content: 70% by weight) (Prepolymer B).

REFERENCE EXAMPLE 3

Production of Prepolymer C

Substantially the same procedure as in Reference Example 1 is repeated except that 1.2 moles of polypropylene glycol (as a diol, $\overline{Mn}$=2,000) and 0.8 mole of polyethylene adipate (as a diol, $\overline{Mn}$=2000) are used instead of 1 mole of polypropylene glycol and 1 mole of polytetramethylene glycol. Thus, there is obtained an unsaturated polyurethane ($\overline{Mn}$=11,000; ether bond content: 51% by weight) (Prepolymer C).

REFERENCE EXAMPLE 4

Production of Prepolymer D

Substantially the same procedure as in Reference Example 1 is repeated except that 1 mole of polyethylene adipate (as a diol, $\overline{Mn}$=2,000) is used instead of 1 mole of polytetramethylene glycol. Thus, there is obtained an unsaturated polyurethane ($\overline{Mn}$=11,000; ether bond content: 42% by weight) (Prepolymer D).

REFERENCE EXAMPLE 5

Production of Prepolymer E

Substantially the same procedure as in Reference Example 1 is repeated except that 2 moles of polyethylene adipate (as a diol, $\overline{Mn}$=2,000) is used instead of 1 mole of polypropylene glycol and 1 mole of polytetramethylene glycol. Thus, there is obtained an unsaturated polyurethane ($\overline{Mn}$=11,000; ether bond content: 0% by weight) (Prepolymer E).

REFERENCE EXAMPLE 6

Production of Prepolymer F 0.29 mole of fumaric acid ($\overline{Mn}$=116) which is an unsaturated dibasic acid, 0.47 mole of adipic acid ($\overline{Mn}$=146) and 0.24 mole of isophthalic acid ($\overline{Mn}$=166) which are saturated dibasic acid, 1 mole of polyethylene glycol (as a diol, $\overline{Mn}$=200) and 0.25% by weight, relative to the total weight of the acids, of triethanolamine phosphate which is a heat-polymerization inhibitor are mixed. In the mixture, the total amount of acids is 1 mole. The mixture is heated at 150° C. for 2 hours in an atmosphere of nitrogen gas to advance a polycondensation reaction. When the amount of water formed in the reaction reaches the amount indicating that the advance of the reaction reaches 85%, the reaction system is heated to 220° C. and the reaction is continued for 1 hour. Then, the pressure of the reaction system is reduced to 90 mmHg and the reaction is further conducted at 220° C. until the acid value of the mixture becomes 20. Then, the temperature of the reaction mixture is gradually decreased to 85° C. or below and, subsequently, the pressure is gradually returned to an atmospheric pressure, to thereby obtain a polymer ($\overline{M}n$=2,800; ether bond content: 58% by weight) (Prepolymer F).

REFERENCE EXAMPLE 7

Production of Binder Polymer G 0.1 mole of polyoxyethylene glycol ($\overline{M}n$=1372), 0.1 mole of trimellitic acid anhydride ($\overline{M}n$=192), 0.45 mole of ε-caprolactam ($\overline{M}n$=114) and 0.1% by weight of N,N'-hexamethylene-bis(3,5-di-t-butyl-4-hydroxycinnamic acid amide (trade name: Irganox® 1098, manufactured and sold by CIBA-Geigy AG, Switzerland) are charged into a 500 ml-volume separable flask equipped with a stirrer, an inlet for nitrogen gas and an outlet for a distillate. Nitrogen gas is introduced into the flask and the mixture is heated at 260° C. for 4 hours in an atmosphere of nitrogen gas to advance a reaction. Then, to the reaction mixture is added tetraisopropyl orthotitanate in an amount of 0.2% by weight relative to the total weight of the resultant mixture. The mixture is heated at 260° C. under reduced pressure to remove ε-caprolactam remaining unreacted. The reaction is further conducted for 4 hours under reduced pressure, to thereby obtain a light yellow elastomer (Binder polymer G). The amount of ε-caprolactam remaining unreacted which is recovered from the reaction mixture is 0.14 mole. Binder polymer G has a number average molecular weight ($\overline{M}n$) of 130,000 and an ether bond content of 72% by weight.

EXAMPLE 1

70 Parts by weight of Polymer A obtained in Reference Example 1 is mixed with two types of ethylenically unsaturated monomers, i.e., 29 parts by weight of polypropylene glycol monomethacrylate (hereinafter referred to as "PGMA") ($\overline{M}n$≈380) and 1.0 part by weight of trimethylolpropane trimethacrylate (hereinafter referred to as "TMPT"). To the resultant mixture are added 2,2-dimethoxy-2-phenylacetophenone (hereinafter referred to as "DMPA") as a photopolymerization initiator, 2,6-di-t-butyl-p-cresol (hereinafter referred to as "BHT") as a heat-polymerization inhibitor and bis(1,2,2,6,6-pentamethyl-4-piperidyl) sebacate (hereinafter referred to as "LS-II") as a light stabilizer in amounts of 0.7 part by weight, 0.5 part by weight and 0.8 part by weight, respectively. Thus, there is obtained a photosensitive resin composition. The transparency of the composition is observed according to the method of item (v) as mentioned above. The result is shown in Table 2.

From the thus obtained photosensitive resin composition, a relief printing plate having a thickness of 7 mm is prepared according to the method of item (i) as mentioned above. Then, the accelerated printing resistance before storage of the plate is determined according to the method of item (ii) as mentioned above. The results are shown in Table 2. As is apparent from the results, the breakage percentage of relief is as small as 15%.

EXAMPLE 2 TO 7

Substantially the same procedure as in Example 1 is repeated except that the concentration of LS-II added is changed to 0.5 part by weight in Example 2, 1.0 part by weight in Example 3, 3.0 parts by weight in Example 4, 5.0 parts by weight in Example 5, 7.0 parts by weight in Example 6 and 10.0 parts by weight in Example 7, respectively. Thus, there are obtained photosensitive resin compositions. The transparency of each composition is observed according to the method of item (v) as mentioned above. From each of the photosensitive resin compositions, a relief printing plate having a thickness of 7 mm is prepared according to the method of item (i) as mentioned above, and the accelerated printing resistance before storage of the plate is determined according to the method of item (ii) as mentioned above. The results are shown in Table 2. As is apparent from the results, the breakage percentages of relief of the plates are as small as 4 to 10%.

COMPARATIVE EXAMPLE 1

Substantially the same procedure as in Example 1 is repeated except that no hindered amine is used, to thereby obtain a photosensitive resin composition. The transparency of the composition is observed according to the method of item (v) as mentioned above. From the composition, a photocured resin plate is prepared according to the method of item (i) as mentioned above, and the accelerated printing resistance before storage of the plate is determined according to the method of item (ii) as mentioned above. The results are shown in Table 2. As is apparent from the results, the breakage percentage of relief of the plate is as large as 43%.

TABLE 2

| | prepolymer | | ethylenically unsaturated monomer | | light stabilizer | | photopoly- merization initiator | | content of ether bond- containing segment (% by weight) | thick- ness of relief print- ing plate (nm) | breakage percentage of relief in accelarated printing resistance test before storage (%) | trans- parency of photo- sensitive com- position |
|---|---|---|---|---|---|---|---|---|---|---|---|---|
| | type | amount (parts by weight) | type | amount (parts by weight) | type | amount (parts by weight) | type | amount (parts by weight) | | | | |
| Example | | | | | | | | | | | | |
| 1 | A | 70 | PGMA TMPT | 29 1 | LS-II | 0.08 | DMPA | 0.7 | 82 | 7 | 15 | ◯ |
| 2 | A | 70 | PGMA | 29 | LS-II | 0.5 | DMPA | 0.7 | 82 | 7 | 10 | ◯ |

TABLE 2-continued

| | prepolymer | | ethylenically unsaturated monomer | | light stabilizer | | photopoly-merization initiator | | content of ether bond-containing segment (% by weight) | thickness of relief printing plate (mm) | breakage percentage of relief in accelarated printing resistance test before storage (%) | transparency of photosensitive composition |
|---|---|---|---|---|---|---|---|---|---|---|---|---|
| | type | amount (parts by weight) | type | amount (parts by weight) | type | amount (parts by weight) | type | amount (parts by weight) | | | | |
| 3 | A | 70 | TMPT<br>PGMA | 1<br>29 | LS-II | 1.0 | DMPA | 0.7 | 82 | 7 | 7 | ○ |
| 4 | A | 70 | TMPT<br>PGMA | 1<br>29 | LS-II | 3.0 | DMPA | 0.7 | 82 | 7 | 5 | ○ |
| 5 | A | 70 | TMPT<br>PGMA | 1<br>29 | LS-II | 5.0 | DMPA | 0.7 | 82 | 7 | 5 | ○ |
| 6 | A | 70 | TMPT<br>PGMA | 1<br>29 | LS-II | 7.0 | DMPA | 0.7 | 82 | 7 | 4 | Δ |
| 7 | A | 70 | TMPT<br>PGMA | 1<br>29 | LS-II | 10.0 | DMPA | 0.7 | 82 | 7 | 4 | Δ |
| Comparative Example 1 | A | 70 | TMPT<br>PGMA | 1<br>29 | — | 0 | DMPA | 0.7 | 82 | 7 | 43 | ○ |

EXAMPLES 8 AND 9

Substantially the same procedure as in Example 1 is repeated except that 0.5 part by weight of poly {[6-(1,1,3,3-tetramethylbutyl)imino-1,3,5-triazine-2,4-diyl] [(2,2,6,6-tetramethyl-4-piperidyl)imino] hexamethylene [(2,2,6,6-tetramethyl-4-piperidyl)imino]} (hereinafter referred to as "LS-VI") is used in Example 8 instead of LS-II, and that 0.5 part by weight of tetrakis(2,2,6,6-tetramethyl-4-piperidyl)-1,2,3,4-butanetetracarboxylate) (hereinafter referred to as "LS-VII") is used in Example 9 instead of LS-II, to thereby obtain photosensitive resin compositions. The transparency of each composition is observed according to the method of item (v) as mentioned above. From each of the photosensitive resin compositions, a relief printing plate having a thickness of 7 mm is prepared according to the method of item (i) as mentioned above, and the accelerated printing resistance before storage of the plate is determined according to the method of item (ii) as mentioned above. The results are shown in Table 3.

EXAMPLE 10

Substantially the same procedure as in Example 1 is repeated except that Prepolymer C obtained in Reference Example 3 is used instead of Prepolymer A, to thereby obtain a photosensitive resin composition. The transparency of the composition is observed according to the method of item (v) as mentioned above. From the photosensitive resin composition, a relief printing plate having a thickness of 7 mm is prepared according to the method of item (i) as mentioned above, and the accelerated printing resistance before storage of the plate is determined according to the method of item (ii) as mentioned above. The results are shown in Table 3.

COMPARATIVE EXAMPLES 2 TO 4

Substantially the same procedure as in Example 1 is repeated except that 0.5 part by weight of 2-hydroxybenzophenone (hereinafter referred to as "UV-I"), 0.5 part by weight of 2-(2'-hydroxy-3'-tertiary-butyl-5'-methylphenyl)-5-chlorobenzotriazole (hereinafter referred to as "UV-II"), and 0.5 part by weight of 2,4-di-tertiary-butylphenyl-3',5'-di-tertiary-butyl-4-hydroxybenzoate (hereinafter referred to as "UV-III") are respectively used in Comparative Examples 2, 3 and 4 as a light stabilizer instead of LS-II, to thereby obtain photosensitive resin compositions. The transparency of each composition is observed according to the method of item (v) as mentioned above. From each of the photosensitive resin compositions, a relief printing plate having a thickness of 7 mm is prepared according to the method of item (i) as mentioned above, and the accelerated printing resistance before storage of the plate is determined according to the method of item (ii) as mentioned above. The results are shown in Table 3.

COMPARATIVE EXAMPLE 5

Substantially the same procedure as in Example 10 is repeated except that no light stabilizer is added, to obtain a photosensitive resin composition. The transparency of the composition is observed according to the method of item (v) as mentioned above. From the photosensitive resin composition, a relief printing plate having a thickness 7 mm is prepared according to the method of item (i) as mentioned above, and the accelerated printing resistance before storage of the plate is determined according to the method of item (ii) as mentioned above. The results are shown in Table 3.

As is apparent from the results in Table 3, the breakage percentages of relief of the plate prepared in Examples 8 to 10 are as small as 6 to 8%. By contrast, the breakage percentages of relief of the plates prepared in Comparative Examples 2 to 5 are as large as 37 to 43%.

TABLE 3

| | prepolymer | | ethylenically unsaturated monomer | | light stabilizer | | photopoly-merization initiator | | content of ether bond-containing segment (% by weight) | thick-ness of relief print-ing plate (nm) | breakage percentage of relief in accelarated printing resistance test before storage (%) | trans-parency of photo-sensitive com-position |
|---|---|---|---|---|---|---|---|---|---|---|---|---|
| | type | amount (parts by weight) | type | amount (parts by weight) | type | amount (parts by weight) | type | amount (parts by weight) | | | | |
| Example | | | | | | | | | | | | |
| 8 | A | 70 | PGMA TMPT | 29 1 | LS-VI | 0.5 | DMPA | 0.7 | 82 | 7 | 6 | ○ |
| 9 | A | 70 | PGMA TMPT | 29 1 | LS-VII | 0.5 | DMPA | 0.7 | 82 | 7 | 8 | ○ |
| 10 | C | 70 | PGMA TMPT | 29 1 | LS-II | 0.5 | DMPA | 0.7 | 58 | 7 | 7 | ○ |
| Comparative Example | | | | | | | | | | | | |
| 2 | A | 70 | PGMA TMPT | 29 1 | UV-I | 0.5 | DMPA | 0.7 | 82 | 7 | 37 | ○ |
| 3 | A | 70 | PGMA TMPT | 29 1 | UV-II | 0.5 | DMPA | 0.7 | 82 | 7 | 42 | ○ |
| 4 | A | 70 | PGMA TMPT | 29 1 | UV-III | 0.5 | DMPA | 0.7 | 82 | 7 | 43 | ○ |
| 5 | C | 70 | PGMA TMPT | 29 1 | — | — | DMPA | 0.7 | 58 | 7 | 38 | ○ |

EXAMPLE 11

Substantially the same procedure as in Example 4 is repeated except that Prepolymer B obtained in Reference Example 2 is used instead of Prepolymer A, to thereby obtain a photosensitive resin composition. The transparency of the composition is observed according to the method of item (v) as mentioned above. From the photosensitive resin composition, a relief printing plate having a thickness of 7 mm is prepared according to the method of item (i) as mentioned above, and the accelerated printing resistance before storage and the accelerated printing resistance after storage of the plate are determined according to the method of items (ii) and (iii) as mentioned above. The results are shown in Table 4.

EXAMPLE 12

Substantially the same procedure as in Example 4 is repeated except that Prepolymer C obtained in Reference Example 3 is used instead of Prepolymer A, to thereby obtain a photosensitive resin composition. The transparency of the composition is observed according to the method of item (v) as mentioned above. From the photosensitive resin composition, a relief printing plate having a thickness of 7 mm is prepared according to the method of item (i) as mentioned above, and the accelerated printing resistance before storage and the accelerated printing resistance after storage of the plate are determined according to the method of items (ii) and (iii) as mentioned above. The results are shown in Table 4.

EXAMPLE 13

Substantially the same procedure as in Example 4 is repeated except that Prepolymer D obtained in Reference Example 4 is employed instead of Prepolymer A, thereby obtaining a photosensitive resin composition. The transparency of the composition is observed according to the method of item (v) as mentioned above. From the photosensitive resin composition, a relief printing plate having a thickness of 7 mm is prepared according to the method of item (i) as mentioned above, and the accelerated printing resistance before storage and the accelerated printing resistance after storage of the plate are determined according to the method of items (ii) and (iii) as mentioned above. The results are shown in Table 4.

EXAMPLE 14

Substantially the same procedure as in Example 4 is repeated except that Prepolymer E obtained in Reference Example 5 is employed instead of Prepolymer A, thereby obtaining a photosensitive resin composition. The transparency of the composition is observed according to the method of item (v) as mentioned above. From the photosensitive resin composition, a relief printing plate having a thickness of 7 mm is prepared according to the method of item (i) as mentioned above, and the accelerated printing resistance before storage and the accelerated printing resistance after storage of the plate are determined according to the method of items (ii) and (iii) as mentioned above. The results are shown in Table 4.

COMPARATIVE EXAMPLES 6 TO 8

Substantially the same procedures as in Examples 11, 13 and 14 are respectively repeated except that no light stabilizer is used, thereby obtaining three types of photosensitive resin compositions. The transparency of each of the compositions is observed according to the method of item (v) as mentioned above. From each of the photosensitive resin compositions, a relief printing plate having a thickness of 7 mm is prepared according to the method of item (i) as mentioned above, and the accelerated printing resistance before storage and the accelerated printing resistance after storage of the plate are determined according to the method of items (ii) and (iii) as mentioned above. The results are shown in Table 4.

As apparent from Table 4, with respect to the accelerated printing resistance before storage, the plates prepared in Examples 11 to 14 have excellent accelerated printing resistances as compared to those of the plates prepared in Comparative Examples 6 to 8. That is, the breakage percentages of relief of the plates prepared in Examples 11 to 14 are advantageously as low as 6 to 15%. By contrast, the breakage percentages of relief of the plates prepared in Comparative Examples 6 to 8 are disadvantageously as high as 30 to 40%.

breakage percentage of relief between the plates prepared from a photosensitive resin composition containing a light stabilizer (Examples 11, 13 and 14) and the plates prepared from a photosensitive resin composition containing no light stabilizer (Comparative Examples 6 to 8) is large. This means that the effect of the light stabilizer (component (C) of the photosensitive resin composition of the present invention) is enhanced according to the increase of the ether bond content.

TABLE 4

| | prepolymer | | ethylenically unsaturated monomer | | light stabilizer | | photopolymerization initiator | | content of ether bond-containing segment (% by weight) |
|---|---|---|---|---|---|---|---|---|---|
| | type | amount (parts by weight) | type | amount (parts by weight) | type | amount (parts by weight) | type | amount (parts by weight) | |
| Example | | | | | | | | | |
| 11 | B | 70 | PGMA | 29 | LS-II | 3.0 | DMPA | 0.7 | 71 |
| | | | TMPT | 1 | | | | | |
| 12 | C | 70 | PGMA | 29 | LS-II | 3.0 | DMPA | 0.7 | 58 |
| | | | TMPT | 1 | | | | | |
| 13 | D | 70 | PGMA | 29 | LS-II | 3.0 | DMPA | 0.7 | 52 |
| | | | TMPT | 1 | | | | | |
| 14 | E | 70 | PGMA | 29 | LS-II | 3.0 | DMPA | 0.7 | 22 |
| | | | TMPT | 1 | | | | | |
| Comparative Example | | | | | | | | | |
| 6 | B | 70 | PGMA | 29 | — | — | DMPA | 0.7 | 71 |
| | | | TMPT | 1 | | | | | |
| 7 | D | 70 | PGMA | 29 | — | — | DMPA | 0.7 | 52 |
| | | | TMPT | 1 | | | | | |
| 8 | E | 70 | PGMA | 29 | — | — | DMPA | 0.7 | 22 |
| | | | TMPT | 1 | | | | | |

| | thickness of relief printing plate (mm) | breakage percentage of relief in accelarated printing resistance test before storage (%) | breakage percentage of relief in accelarated printing resistance test after storage (%) | transparency of photosensitive composition |
|---|---|---|---|---|
| Example | | | | |
| 11 | 7 | 6 | 7 | O |
| 12 | 7 | 6 | 10 | O |
| 13 | 7 | 7 | 25 | O |
| 14 | 7 | 15 | 30 | O |
| Comparative Example | | | | |
| 6 | 7 | 40 | 48 | O |
| 7 | 7 | 35 | 48 | O |
| 8 | 7 | 30 | 52 | O |

Further, with respect to the accelerated printing resistance after storage also, the plates prepared in Examples 11 to 14 have excellent accelerated printing resistances as compared to those of the plates prepared in Comparative Examples 6 to 8. That is, the breakage percentages of relief of the plates prepared in Examples 11 to 14 are advantageously as low as 7 to 30%. By contrast, the breakage percentages of relief of the plates prepared in Comparative Examples 6 to 8 are disadvantageously as high as 48 to 52%.

It is also apparent from the results shown in Table 4 that with respect to both cases of the accelerated printing resistances before storage and after storage, when the ether bond content of the polymer becomes high, the difference in the

EXAMPLES 15 TO 17

Substantially the same procedure as in Example 4 is repeated except that the thickness of the printing plate is changed to 1 mm in Example 15, 2 mm in Example 16 and 3 mm in Example 17. The results are shown in Table 5.

COMPARATIVE EXAMPLES 9 TO 11

Substantially the same procedure as in Comparative Example 1 is repeated except that the thickness of the printing plate is changed to 1 mm in Comparative Example 9, 2 mm in Comparative Example 10 and 3 mm in Comparative Example 11. The results are shown in Table 5.

As apparent from Table 5, in the case of the plates prepared in Examples 15 to 17, the breakage percentages of relief are low regardless to the thickness of the photocured resin layer. By contrast, in the case of the plates prepared in Comparative Examples 9 to 11, the breakage percentages of relief are increased according to the increase of the thickness of the photocured layer.

COMPARATIVE EXAMPLES 12 AND 13

Substantially the same procedures as in Examples 18 and 19 including the measurement of the practical printing resistance are respectively repeated in Comparative Examples 12 and 13 except that a hindered amine is not used. The results are shown in Table 6.

TABLE 5

| | prepolymer | | ethylenically unsaturated monomer | | light stabilizer | | photopoly- merization initiator | | content of ether bond- containing segment (% by weight) | thick- ness of relief print- ing plate (nm) | breakage percentage of relief in accelarated printing resistance test before storage (%) | trans- parency of photo- sensitive com- position |
|---|---|---|---|---|---|---|---|---|---|---|---|---|
| | type | amount (parts by weight) | type | amount (parts by weight) | type | amount (parts by weight) | type | amount (parts by weight) | | | | |
| Example | | | | | | | | | | | | |
| 15 | A | 70 | PGMA TMPT | 29 1 | LS-II | 3.0 | DMPA | 0.7 | 82 | 1 | 7 | ○ |
| 16 | A | 70 | PGMA TMPT | 29 1 | LS-II | 3.0 | DMPA | 0.7 | 82 | 2 | 8 | ○ |
| 17 | A | 70 | PGMA TMPT | 29 1 | LS-II | 3.0 | DMPA | 0.7 | 82 | 3 | 9 | ○ |
| Com- parative Example | | | | | | | | | | | | |
| 9 | A | 70 | PGMA TMPT | 29 1 | — | 0 | DMPA | 0.7 | 82 | 1 | 7 | ○ |
| 10 | A | 70 | PGMA TMPT | 29 1 | — | 0 | DMPA | 0.7 | 82 | 2 | 9 | ○ |
| 11 | A | 70 | PGMA TMPT | 29 1 | — | 0 | DMPA | 0.7 | 82 | 3 | 14 | ○ |

EXAMPLES 18 AND 19

A printing plate having a thickness of 7 mm is prepared from each of the photosensitive resin compositions obtained in Example 1 (in Example 18) and that obtained in Example 10 (in Example 19) and subjected to measurement of the practical printing resistance according to the method of item (iv) as mentioned before. As a result, no chipped portion is observed in the 30,000th printed corrugated board.

As is apparent from Table 6, 13 chipped portions and 9 chipped portions are observed in the print patterns on the 30,000th printed boards in Comparative Examples 12 and 13, respectively.

TABLE 6

| | prepolymer | | ethylenically unsaturated monomer | | light stabilizer | | photopoly- merization initiator | | content of ether bond- containing segment (% by weight) | thick- ness of relief print- ing plate (nm) | practical printing resistance (in terms of number of chipped portion of relief pattern after used for printing 30,000 corrugated boards) |
|---|---|---|---|---|---|---|---|---|---|---|---|
| | type | amount (parts by weight) | type | amount (parts by weight) | type | amount (parts by weight) | type | amount (parts by weight) | | | |
| Example | | | | | | | | | | | |
| 18 | A | 70 | PGMA TMPT | 29 1 | LS-II | 3.0 | DMPA | 0.7 | 82 | 7 | 0 |
| 19 | C | 70 | PGMA TMPT | 29 1 | LS-II | 3.0 | DMPA | 0.7 | 58 | 7 | 0 |
| Com- parative Example | | | | | | | | | | | |
| 12 | A | 70 | PGMA TMPT | 29 1 | — | 0 | DMPA | 0.7 | 82 | 7 | 13 |
| 13 | C | 70 | PGMA TMPT | 29 1 | — | 0 | DMPA | 0.7 | 58 | 7 | 9 |

EXAMPLE 20

60 Parts by weight of Prepolymer F obtained in Reference Example 6 is blended with ethylenically unsaturated monomers, that is, 20 parts by weight of lauryl methacrylate (hereinafter referred to as "LMA"), 13 parts by weight of 2-hydroxyethyl methacrylate (hereinafter referred to as "HEMA") and 7 parts by weight of diethylene glycol dimethacrylate (hereinafter referred to as "DEGMA"). To the resultant mixture are added 2 parts by weight of benzoine isobutylether as a photopolymerization initiator, 1 part by weight of bis(1,2,2,6,6-pentamethyl-4-piperidyl) sebacate (LS-II) as a light stabilizer and 0.5 part by weight of 2,6-di-t-butyl-p-cresol as a heat-polymerization inhibitor, to thereby obtain a photosensitive resin composition.

The transparency of the composition is observed according to the method of item (v) as mentioned above. From the photosensitive resin composition, relief printing plate having a thickness of 7 mm is prepared according to the method of item (i) as mentioned above, and the accelerated printing resistance before storage of the plate is determined according to the method of item (ii) as mentioned above. The results are shown in Table 7.

COMPARATIVE EXAMPLE 14

Substantially the same procedure as in Example 20 is repeated except that no light stabilizer is used, to thereby obtain a photosensitive resin composition. The transparency of the composition is observed according to the method of item (v) as mentioned above. From the photosensitive resin composition, a relief printing plate having a thickness of 7 mm is prepared according to the method of item (i) as mentioned above, and the accelerated printing resistance before storage of the plate is determined according to the method of item (ii) as mentioned above. The results are shown in Table 7.

2,2'-dimethoxy-2-phenyl acetophenone as a photopolymerization initiator, 1 part by weight of LS-II as a light stabilizer, and 0.1 part by weight of 2,6-di-t-butyl-p-cresol as a heat-polymerization inhibitor and 5 parts by weight of N-ethyltoluenesulfonamide. Then, the methanol is distilled off from the above-obtained solution, to thereby obtain a uniform and transparent composition. The transparency of the composition is observed according to the method of item (v) as mentioned above.

The thus obtained composition is put into the space defined by a polyester film having a thickness of 0.1 mm and another polyester film having a thickness of 0.1 mm which have both been coated with an adhesive in advance and a spacer having a thickness of 7.5 mm. The whole is disposed between hot plates of a press-molding machine, and heat pressing is performed at 120° C. under a pressure of 150 kg/cm$^2$, to thereby obtain a transparent photosensitive resin composition layer having a thickness of 7.0 mm bonded to the 0.1 mm-thick polyester films through the adhesive. Then, the thus obtained sheet is irradiated using an ultraviolet-fluorescent lamp at an actinic ray intensity of 2.0 mW/cm$^2$ for 10 minutes from the side of one of the adhesive-coated polyester films, to conduct back exposure. The polyester film which is attached to the resin composition layer on the side opposite to the irradiated side is peeled off and a negative film is contacted to the resin composition layer. The relief exposure is conducted for 40 minutes using the ultraviolet-fluorescent lamp at an actinic ray intensity of 2.0 mW/cm$^2$. Then, the negative film is removed and uncured resin composition is washed out with water at 30° C. for 5 min using a brush-type developing processor (model 200-W, manufactured and sold by Asahi Kasei Kogyo K. K., Japan). Then, using the above-mentioned light source, the resultant plate is irradiated for 10 min, to thereby obtain a relief printing plate. The accelerated printing resistance before storage of the plate is determined according to the method of item (ii) as mentioned above. The results are shown in Table 8.

TABLE 7

| | prepolymer | | ethylenically unsaturated monomer | | light stabilizer | | photopolymerization initiator | | content of ether bond-containing | thickness of relief | breakage percentage of relief in accelarated printing |
|---|---|---|---|---|---|---|---|---|---|---|---|
| | type | amount (parts by weight) | type | amount (parts by weight) | type | amount (parts by weight) | type | amount (parts by weight) | segment (% by weight) | printing plate (mm) | resistance test before storage (%) |
| Example 20 | F | 60 | IMA<br>HEMA<br>DEGMA | 20<br>13<br>7 | LS-II | 1 | DMPA | 0.7 | 37 | 7 | 10 |
| Comparative Example 14 | F | 60 | IMA<br>HEMA<br>DEGMA | 20<br>13<br>7 | — | — | DMPA | 0.7 | 37 | 7 | 35 |

EXAMPLE 21

70 Parts by weight of Binder polymer G obtained in Reference Example 7 is dissolved in 500 ml of methanol. To the resultant solution are added 14 parts by weight of an acrylate having a hydroxyl group (M-600A,

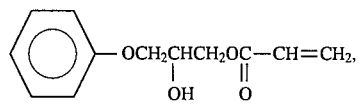

manufactured and sold by Kyoei Sha Yushi K. K., Japan) and 14 parts by weight of ethoxylated bisphenol A diacrylate as ethylenically unsaturated monomers, 1 part by weight of

COMPARATIVE EXAMPLE 15

Substantially the same procedure as in Example 21 is repeated except that no light stabilizer is used, to thereby obtain a photosensitive resin composition. The transparency of the composition is observed according to the method of item (v) as mentioned above. From the photosensitive resin composition, a relief printing plate having a thickness of 7 mm is prepared according to the method of item (i) as mentioned above, and the accelerated printing resistance before storage of the plate is determined according to the method of item (ii) as mentioned above. The results are shown in Table 8.

TABLE 8

| | binder polymer | | ethylenically unsaturated monomer | | light stabilizer | | photopolymerization initiator | | content of ether bond-containing segment (% by weight) | thickness of relief printing plate (mm) | breakage percentage of relief in accelarated printing resistance test before storage (%) |
|---|---|---|---|---|---|---|---|---|---|---|---|
| | type | amount (parts by weight) | type | amount (parts by weight) | type | amount (parts by weight) | type | amount (parts by weight) | | | |
| Example 21 | G | 70 | M-600A[1] ethoxylated bisphenol A acrylate | 14 14 | LS-II | 1 | DMPA | 1 | 51 | 7 | 13 |
| Comparative Example 15 | G | 70 | M-600A ethoxylated bisphenol A acrylate | 14 14 | — | — | DMPA | 1 | 51 | 7 | 40 |

Note:
[1]M-600A, tradename of an acrylic monomer produced and sold by Kyoei Sha Yushi K.K., Japan.

What is claimed is:

1. A corrugated board printing plate having a thickness of from 3 mm to 10 mm produced by a method comprising the steps of:

(a) providing a photosensitive resin layer, then in either order for exposure;

(b) subjecting one surface of said resin layer to relief exposure through a transparency having a transmitting pattern; and (c) subjecting the other surface of said resin layer to back exposure;

(d) subjecting the resultant exposed resin layer to development to obtain a corrugated board printing plate;

(e) washing said corrugated board printing plate; and (f) drying the washed corrugated board printing plate;

wherein said photosensitive resin layer is composed of a photosensitive resin composition comprising:

(A) from 5.0 to 98.0% by weight, based on the total weight of components (A), (B), (C), and (D), of an ethylenically unsaturated polyurethane prepolymer having a number average molecular weight of 5,000 to 100,000, (B) from 1.0 to 94.0% by weight, based on the total weight of components (A), (B), (C), and (D), of an ethylenically unsaturated monomer having a number average molecular weight of less than 2,000, (C) from 0.05 to 10.0% by weight, based on the total weight of components (A), (B), (C), and (D), of a hindered amine having a piperidine ring represented by the formula:

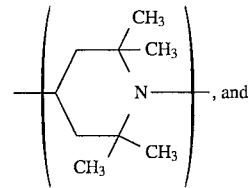

(D) from 0.002 to 10.0% by weight, based on the total weight of components (A), (B), (C), and (D), of a photopolymerization initiator, wherein at least one component selected from the group consisting of component (A) and component (B) contains in its structure a segment containing ether bonds which is represented by the formula:

$$-(R^1-O)_{\overline{n}}  \qquad (IX)$$

wherein $R^1$ represents a hydrocarbon group having from 2 to 20 carbon atoms and n is an integer of 3 or more, said segment being present in an amount of 50% by weight or more, based on the total weight of components (A) and (B), and wherein the weight ratio of said component (A) to said component (B) is from 80.0/19.0 to 30.0/47.0.

2. The corrugated board printing plate according to claim 1, wherein said method further comprises the step of subjecting the other surface of said resin layer to masking exposure through a masking film after step (a) and prior to step (d), wherein the sequence of said masking exposure step, relief exposure step (b), and back exposure step (c) is selected so that said masking exposure step is conducted prior to relief exposure step (b).

* * * * *

(12) EX PARTE REEXAMINATION CERTIFICATE (5151st)
United States Patent
Takahashi et al.

(10) Number: US 5,589,306 C1
(45) Certificate Issued: Jul. 19, 2005

(54) PHOTOSENSITIVE RESIN COMPOSITION FOR PRODUCING A RELIEF PRINTING PLATE

(75) Inventors: Masahiko Takahashi, Fuji (JP); Shusaku Tabata, Fuji (JP)

(73) Assignee: Asahi Kasei Kogyo Kabushiki Kaisha, Osaka (JP)

Reexamination Request:
No. 90/006,890, Dec. 16, 2003

Reexamination Certificate for:
Patent No.: 5,589,306
Issued: Dec. 31, 1996
Appl. No.: 07/985,233
Filed: Dec. 2, 1992

Related U.S. Application Data

(60) Continuation of application No. 07/641,762, filed on Jan. 16, 1991, now abandoned, which is a division of application No. 07/326,902, filed on Mar. 21, 1989, now abandoned.

(30) Foreign Application Priority Data

Mar. 26, 1988 (JP) .............................. 63-072926

(51) Int. Cl.$^7$ .............................. G03C 3/00; G03F 7/035
(52) U.S. Cl. .................... 430/18; 430/286.1; 430/306; 430/309; 430/284.1
(58) Field of Search .............................. 430/18, 286.1, 430/306, 309, 284.1

(56) References Cited

U.S. PATENT DOCUMENTS 3,782,961 A 1/1974 Takahashi et al.
4,279,720 A 7/1981 Berner
4,826,888 A 5/1989 Sasaki et al.
5,288,571 A 2/1994 Nakamura et al.

FOREIGN PATENT DOCUMENTS

GB 2198736 A 6/1988

OTHER PUBLICATIONS

Recent Developments In Photoinitiators, G. Berner, et al., J. Oil Col. Chem. Assoc., vol. 61, pp 105–113 (1978).

Introduction to Hindered Amine Stabilizers, Klemchuk, Ciba Geigy Corp., American Chemical Society pp. 1–10 (1985).

Discovery, Chemistry, and Application of Hindered Amines, Rozantsev et al., American Chemical Society, pp. 11–35 (1985).

*Primary Examiner*—John A. McPherson

(57) ABSTRACT

A photosensitive resin composition for producing a relief printing plate is disclosed, which comprises a polymer selected from the group consisting of a prepolymer, a binder polymer and a mixture thereof, an ethylenically unsaturated monomer, a specific hindered amine and a photopolymerization initiator. Even when the photosensitive resin composition is excessively irradiated with strong actinic rays in order to cure the resin composition to its inner portion sufficiently, the surface of the resin composition does not undergo photodeterioration by virtue of the hindered amine contained therein, thereby imparting excellent toughness to the photocured resin composition throughout the entire thickness thereof. Thus, a relief printing plate having excellent printing resistance can be produced.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–2 is confirmed.

* * * * *